US011619969B2

(12) United States Patent
Jeong et al.

(10) Patent No.: US 11,619,969 B2
(45) Date of Patent: Apr. 4, 2023

(54) DISPLAY APPARATUS

(71) Applicant: Samsung Display Co., Ltd., Yongin-si (KR)

(72) Inventors: Jintae Jeong, Yongin-si (KR); Byungsun Kim, Yongin-si (KR); Chiwook An, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/499,615

(22) Filed: Oct. 12, 2021

(65) Prior Publication Data

US 2022/0066504 A1 Mar. 3, 2022

Related U.S. Application Data

(62) Division of application No. 16/137,266, filed on Sep. 20, 2018, now Pat. No. 11,175,697.

(30) Foreign Application Priority Data

Sep. 26, 2017 (KR) .................. 10-2017-0123828

(51) Int. Cl.
*G06F 1/16* (2006.01)
*H01L 27/32* (2006.01)
(Continued)

(52) U.S. Cl.
CPC .......... *G06F 1/1626* (2013.01); *G06F 1/1637* (2013.01); *G06F 1/1643* (2013.01);
(Continued)

(58) Field of Classification Search
CPC . G06F 1/1626; G06F 3/04; G06F 3/46; G06F 3/04164; G06F 1/1637;
(Continued)

(56) References Cited

U.S. PATENT DOCUMENTS 8,791,455 B2    7/2014  Kim et al.
9,356,087 B1    5/2016  Lee et al.
(Continued)

FOREIGN PATENT DOCUMENTS

CN     106409869 A     2/2017
CN     107004617 A     8/2017
(Continued)

OTHER PUBLICATIONS

Partial European Search Report for corresponding European Patent Application No. 18195995.8, dated Jan. 31, 2019, 15 pages.
(Continued)

*Primary Examiner* — Amare Mengistu
*Assistant Examiner* — Gloryvid Figueroa-Gibson
(74) *Attorney, Agent, or Firm* — Lewis Roca Rothgerber Christie LLP

(57) ABSTRACT

A display apparatus includes a substrate having a display area with a display device to display an image, and a non-display area around the display area. The non-display area has a bending area bent about a bending axis. An encapsulation layer is located over the display area. A touchscreen layer is located over the encapsulation layer and includes a touch electrode. A touch wire is connected to the touch electrode, and extends from an upper portion of the encapsulation layer, and at least partially into the bending area. A fan-out wire configured to apply an electric signal to
(Continued)

the display area and is at least partially disposed in the bending area. The touch wire and the fan-out wire are on different layers from each other in the bending area.

8 Claims, 20 Drawing Sheets

(51) Int. Cl.
  *G06F 3/041* (2006.01)
  *H01L 51/00* (2006.01)
  *H01L 51/52* (2006.01)
  *G06F 3/044* (2006.01)

(52) U.S. Cl.
  CPC .......... *G06F 3/0412* (2013.01); *G06F 3/0446* (2019.05); *G06F 3/04164* (2019.05); *H01L 27/323* (2013.01); *H01L 27/3246* (2013.01); *H01L 27/3258* (2013.01); *H01L 27/3262* (2013.01); *H01L 27/3276* (2013.01); *H01L 51/0097* (2013.01); *H01L 51/5253* (2013.01); *G06F 3/044* (2013.01); *G06F 2203/04102* (2013.01); *H01L 2251/5338* (2013.01); *H01L 2251/5392* (2013.01)

(58) Field of Classification Search
  CPC ...... G06F 1/1643; G06F 3/0412; G06F 3/044; G06F 2203/04102; H01L 27/323; H01L 27/03; H01L 27/246; H01L 27/3258; H01L 27/3262; H01L 27/3276; H01L 51/0097; H01L 51/5253; H01L 2251/5338; H01L 2251/5392
  USPC ....................................... 345/174
  See application file for complete search history.

(56) References Cited

U.S. PATENT DOCUMENTS

| | | |
|---|---|---|
| 9,954,200 B2 | 4/2018 | Kim et al. |
| 2014/0055702 A1 | 2/2014 | Park et al. |
| 2014/0210738 A1 | 7/2014 | Hur |
| 2014/0232956 A1* | 8/2014 | Kwon ............... G02F 1/133305 349/12 |
| 2015/0380679 A1 | 12/2015 | Fujiyoshi et al. |
| 2016/0231846 A1 | 8/2016 | Kim et al. |
| 2017/0077447 A1 | 3/2017 | Kang et al. |
| 2017/0090661 A1 | 3/2017 | Kim et al. |
| 2017/0185193 A1 | 6/2017 | Kim |
| 2017/0194404 A1 | 7/2017 | Park et al. |
| 2017/0262109 A1* | 9/2017 | Choi ................... H01L 27/3258 |

FOREIGN PATENT DOCUMENTS

| | | |
|---|---|---|
| EP | 3 217 265 A1 | 9/2017 |
| KR | 10-2012-0060926 A | 6/2012 |
| KR | 10-2014-0045193 A | 4/2014 |
| KR | 10-2014-0079994 A | 6/2014 |
| KR | 10-2014-0096507 A | 8/2014 |
| KR | 10-2017-0032955 A | 3/2017 |
| KR | 10-2017-0080779 A | 7/2017 |
| KR | 10-2017-0106621 A | 9/2017 |

OTHER PUBLICATIONS

Extended European Search Report for corresponding European Patent Application No. 18195995.8, dated Jun. 3, 2019, 17 pages.

* cited by examiner

DISPLAY APPARATUS

CROSS-REFERENCE TO RELATED APPLICATIONS

This application is a divisional of U.S. patent application Ser. No. 16/137,266, filed Sep. 20, 2018, which claims priority to and the benefit of Korean Patent Application No. 10-2017-0123828, filed Sep. 26, 2017, the entire content of both of which is incorporated herein by reference.

BACKGROUND

1. Field

One or more embodiments relate to a display apparatus, and more particularly, to a display apparatus including a bending area.

2. Description of the Related Art

In general, a display apparatus visually displays data. Such a display apparatus includes a substrate divided into a display area and a non-display area. In the display area, gate lines and data lines are insulated from each other and a plurality of pixel areas are defined in the display area at crossings between the gate lines and the data lines. Also, a thin-film transistor (TFT) and a pixel electrode electrically connected to the TFT are provided correspondingly to each of the pixel areas in the display area. Various wires for transmitting an electric signal to the display area may be provided in the non-display area. Also, the display area may further include a touchscreen layer including a touch electrode, and the non-display area may further include touch wires connected to the touchscreen layer.

Visibility of the display apparatus from various angles may be improved or an area of the non-display area may be reduced by bending at least a portion of the display apparatus. Various methods have been sought to reduce an area of the non-display area during a process of manufacturing the above-described bent display apparatus.

SUMMARY

One or more embodiments include a display apparatus in which, while an area of a non-display area of the display apparatus is reduced, defects of a bending area may be reduced.

Additional aspects will be set forth in part in the description which follows and, in part, will be apparent from the description, or may be learned by practice of the presented embodiments.

According to one or more embodiments, a display apparatus includes: a substrate including a display area where a display device is provided to display an image, and a non-display area around the display area, wherein the non-display area includes a bending area bent about a bending axis; an encapsulation layer over the display area; a touchscreen layer over the encapsulation layer and including a touch electrode; a touch wire connected to the touch electrode, extending from an upper portion of the encapsulation layer, and at least partially in the bending area; and a fan-out wire applying an electric signal to the display area and at least partially disposed at the bending area, wherein the touch wire and the fan-out wire are on different layers from each other in the bending area.

The fan-out wire may include a connection wire in the bending area, and an inside wire on a different layer from the connection wire, and the connection wire may be connected to the inside wire through a contact hole between the bending area and the display area, wherein the touch wire may continuously extend from the upper portion of the encapsulation layer and may be in the bending area.

Elongations of the touch wire and the connection wire may be greater than an elongation of the inside wire.

The display apparatus may further include a thin film transistor in the display area, the thin film transistor including a semiconductor layer and a gate electrode insulated from each other by a first gate insulation layer, wherein the inside wire may be on the same layer as the gate electrode and may include same material as the gate electrode.

An upper organic material layer may be between the fan-out wire and the touch wire in the bending area.

The display apparatus may further include: a thin film transistor in the display area; a planarization layer covering the thin film transistor and including an organic material; a pixel-defining layer including an opening defining an emission area on the planarization layer; and a spacer on the pixel-defining layer, wherein the upper organic material layer may be physically separated from the planarization layer, the pixel-defining layer, and the spacer.

The upper organic material layer may include at least one of a first upper organic material layer including same material as the planarization layer, a second upper organic material layer including same material as the pixel-defining layer, and a third upper organic material layer including same material as the spacer.

The touchscreen layer may include a first touch conductive layer, a first insulation layer, a second touch conductive layer, and a second insulation layer which are sequentially stacked.

The touch wire may include same material as the second touch conductive layer, the first insulation layer may extend from an upper portion of the encapsulation layer to the non-display area, and an end of the first insulation layer may be between the display area and the bending area.

The display apparatus may further include: an additional organic material layer covering the end of the first insulation layer, wherein the additional organic material layer may be in at least a portion of the bending area, and the touch wire may be on the additional organic material layer.

The touch wire may include same material as the first touch conductive layer.

The touch wire may include a first touch wire layer including same material as the first touch conductive layer and a second touch wire layer including same material as the second touch conductive layer, wherein a touch-organic material layer may be between the first touch wire layer and the second touch wire layer, and the first touch wire layer and the second touch wire layer may be electrically connected to each other through a via hole.

The touch wire may include a plurality of touch wires, and the plurality of touch wires may include: at least one lower touch wire including same material as the first touch conductive layer; and at least one upper touch wire including same material as the second touch conductive layer, wherein the lower touch wire and the upper touch wire may be alternately arranged along the bending axis.

The display apparatus may further include: a bending protection layer over the touch wire at the bending area.

The display apparatus may further include: a cover layer over the touchscreen layer.

The touch wire may include same material as the fan-out wire, and resistivity of the touch wire may be different from that of the fan-out wire.

The display apparatus may further include: an organic material layer in at least a portion between the fan-out wire and the substrate at the bending area.

The display apparatus may further include: an inorganic insulation layer between the substrate and the fan-out wire, wherein the inorganic insulation layer may include an opening or a groove corresponding to the bending area.

The display apparatus may further include: a thin film transistor in the display area and including a semiconductor layer, a gate electrode, a source electrode, and a drain electrode, wherein the touchscreen layer may include a first touch conductive layer, a first insulation layer, and a second touch conductive layer which are sequentially stacked, wherein the fan-out wire may be formed of same material as and concurrently (e.g. simultaneously) with the source electrode or the drain electrode, and the touch wire may be formed of same material as and concurrently with at least one of the first touch conductive layer and the second touch conductive layer.

According to one or more embodiments, a display apparatus includes: a substrate including a display area where a display device is provided to display an image, and a non-display area around the display area, wherein the non-display area includes a bending area bent about a bending axis; an encapsulation layer disposed over the display area; a touchscreen layer over the encapsulation layer and including a touch electrode; a touch wire connected to the touch electrode, extending from an upper portion of the encapsulation layer, and at least partially in the bending area; a fan-out wire applying an electric signal to the display area and at least partially disposed at the bending area; and an upper organic material layer on the fan-out wire, wherein the touch wire and the fan-out wire are on the same layer in the bending area, and the upper organic material layer is not on the touch wire.

The display apparatus may further include a bending protection layer over the touch wire and the fan-out wire in the bending area.

The fan-out wire may include a connection wire in the bending area, and an inside wire on a different layer from the connection wire, and the connection wire may be connected to the inside wire through a contact hole between the bending area and the display area, wherein the touch wire may continuously extend from the upper portion of the encapsulation layer and may be in the bending area.

Elongations of the touch wire and the connection wire may be greater than an elongation of the inside wire.

The touch wire may include same material as the fan-out wire, and resistivity of the touch wire may be different from that of the fan-out wire.

The display apparatus may further include: an inorganic insulation layer between the substrate and the fan-out wire, wherein the inorganic insulation layer may include an opening or a groove corresponding to the bending area.

The display apparatus may further include: an organic material layer in at least a portion of the opening or the groove.

The display apparatus may further include: a thin film transistor in the display area and including a semiconductor layer, a gate electrode, a source electrode, and a drain electrode, wherein the touchscreen layer may include a first touch conductive layer, a first insulation layer, and a second touch conductive layer which are sequentially stacked, wherein the fan-out wire may be formed of same material as and concurrently with the source electrode or the drain electrode, and the touch wire may be formed of same material as and concurrently with at least one of the first touch conductive layer and the second touch conductive layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
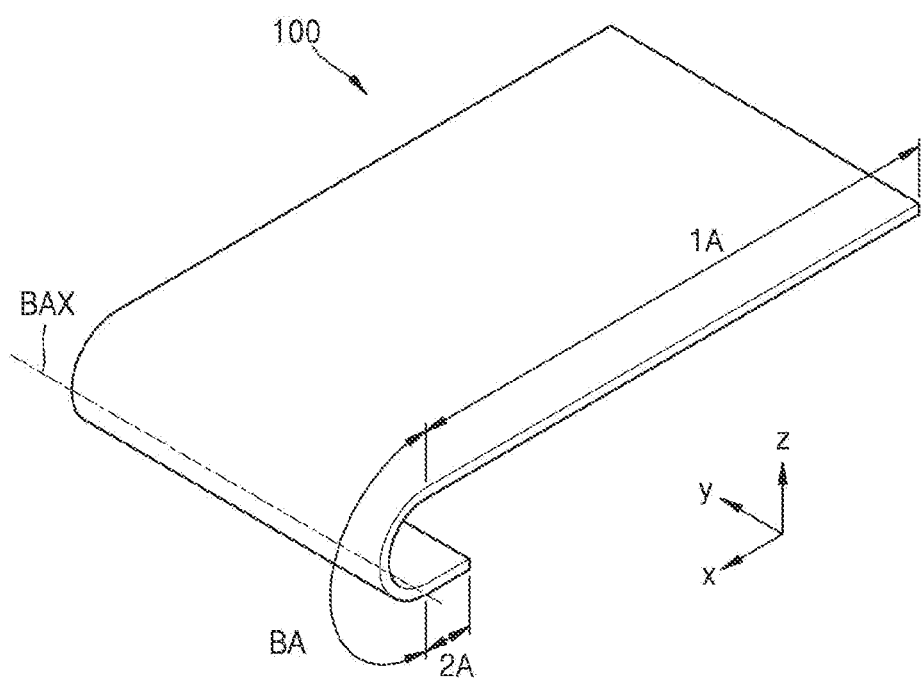
FIG. 1 is a schematic perspective view of a portion of a display apparatus according to an embodiment.

As the inventive concept allows for various changes and numerous embodiments, exemplary embodiments will be illustrated in the drawings and described in detail in the written description. Effects and features of one or more embodiments and methods of accomplishing the same may be understood more readily by reference to the following detailed description of the one or more embodiments and the accompanying drawings. The inventive concept may, however, be embodied in many different forms and should not be construed as being limited to the one or more embodiments set forth herein.

Hereinafter, embodiments will be described in detail with reference to the accompanying drawings. Like reference numerals in the drawings denote like elements, and thus, a repeated description thereof will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being "on" another layer, region, or component, it can be directly or indirectly on the other layer, region, or component. That is, for example, intervening layers, regions, or components may be present.

In the following examples, the x-axis, the y-axis and the z-axis are not limited to the three axes of a rectangular coordinate system and may be interpreted in a broader sense. For example, the x-axis, the y-axis, and the z-axis may be perpendicular to one another or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list.

A display apparatus may display images and may be a liquid crystal display (LCD), an electrophoretic display, an organic light-emitting display, an inorganic light-emitting display, a field emission display, a surface-conduction electron-emitter display, a plasma display, a cathode ray display, or the like.

Hereinafter, an organic light-emitting display will be described as an example of a display apparatus according to an embodiment. However, the display apparatus is not limited thereto, and various types of display apparatuses may be used.

Figure 2A:
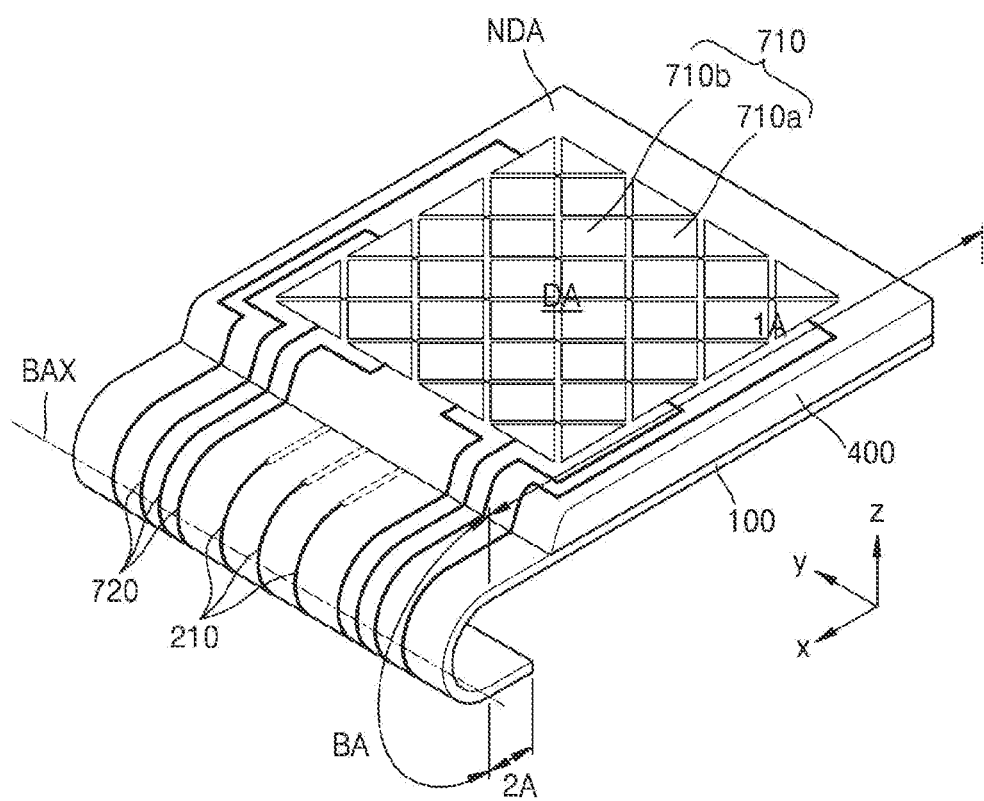
FIG. 2A is a schematic perspective view of a portion of a display apparatus according to an embodiment.
Figure 2B:
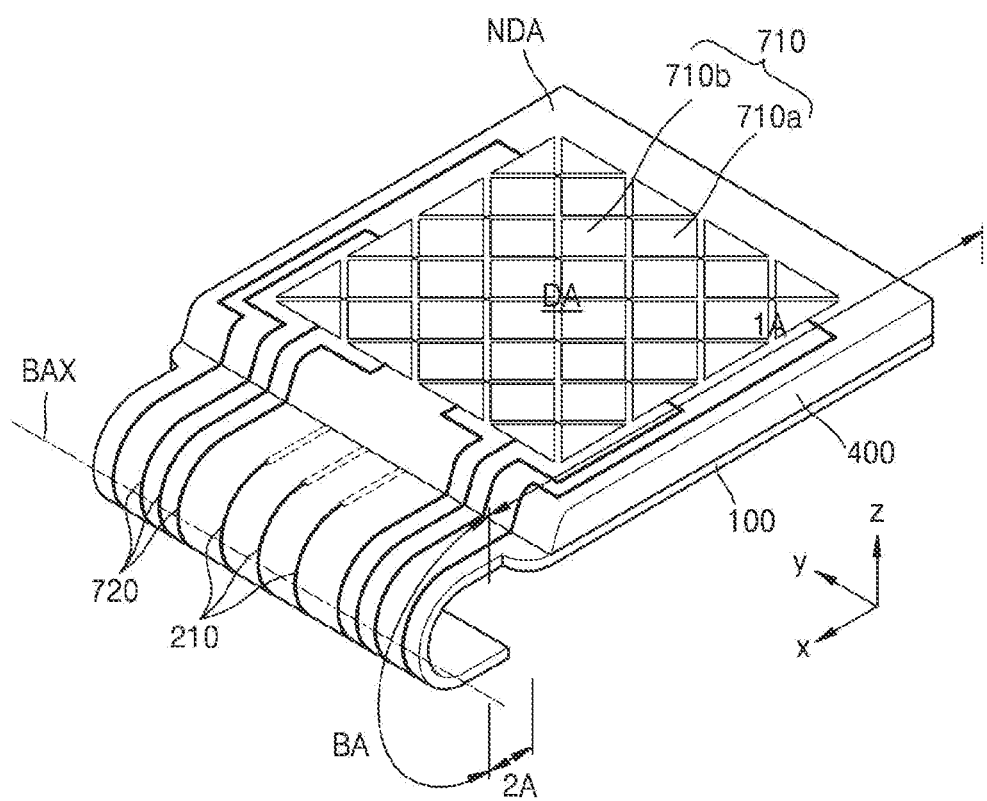
FIG. 2B is a schematic perspective view of a portion of a display apparatus according to an embodiment.
Figure 3:
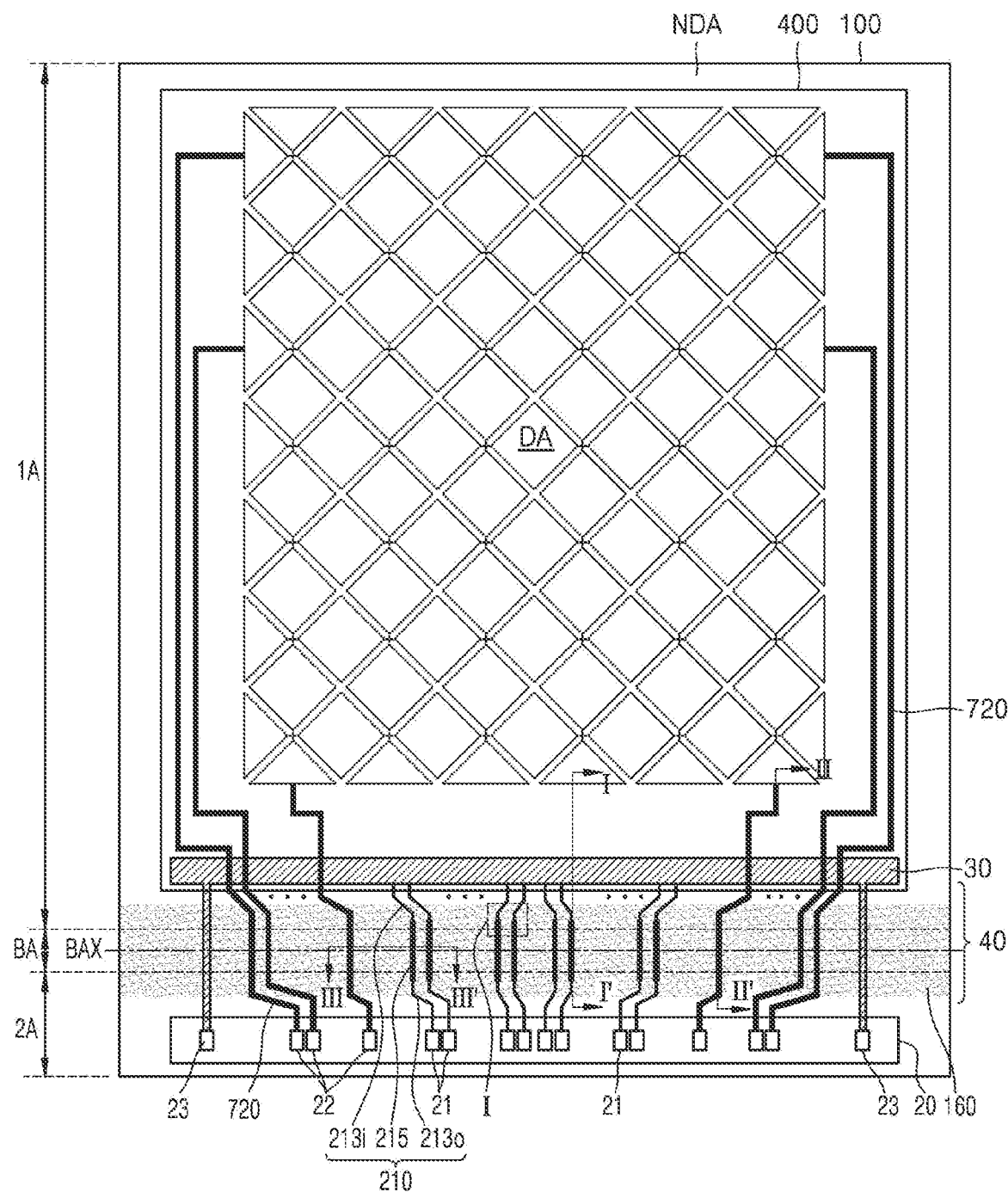
FIG. 3 is a schematic plan view of a portion of a display apparatus according to an embodiment.

Each of FIGS. 1 to 2B is a schematic perspective view of a portion of a display apparatus according to an embodiment, and FIG. 3 is a schematic plan view of the display apparatus of FIG. 2A.

In the display apparatus according to the present embodiment, a substrate 100 which is a part of the display apparatus is partially bent as shown in FIGS. 1 to 2B, and thus, the display apparatus is also partially bent due to the bent substrate 100. However, for convenience of illustration, FIG. 3 shows the display apparatus that is not bent. Other cross-sectional views and plan views according to embodiments that will be described later also show display apparatuses that are not bent, for convenience of illustration.

As shown in FIGS. 1 to 2B, the substrate 100 included in the display apparatus according to the present embodiment is divided into a display area DA and a non-display area NDA around the display area DA. The non-display area NDA includes a bending area BA bent about a bending axis BAX. The bending area BA may refer to an area that is bent to have a radius of curvature.

Although FIGS. 1 and 2A show the substrate 100 that has a substantially rectangular shape, a portion of which is bent, one or more embodiments are not limited thereto. As shown in FIG. 2B, between the bending area BA and the display area DA, the substrate 100 may include an area partially rounded along a perimeter of the display area DA. That is, a width of a side of the substrate 100 may be different from a width of another side of the substrate 100. In FIG. 2B, widths of the side and the other side of the substrate 100 in a first direction (+y direction) may be different from each other. In order to obtain such a shape, cutting may be performed (e.g. using a laser). In addition, the substrate 100 may be formed to have various shapes such as a circular shape, an oval shape, or a polygonal shape.

As shown in FIGS. 1 to 3, the substrate 100 included in the display apparatus according to the present embodiment includes the bending area BA extending in the first direction (+y direction). The bending area BA is located between a first area 1A and a second area 2A, in a second direction (+x direction) crossing the first direction. For example, as shown in FIG. 1, the substrate 100 may be bent about the bending axis BAX extending in the first direction (+y direction). Although FIG. 1 shows that the substrate 100 is bent about the bending axis BAX with the same radius of curvature, one or more embodiments are not limited thereto. The substrate 100 may be bent about the bending axis BAX with non-uniform radii of curvature. The substrate 100 may include various materials having flexible or bendable characteristics, for example, polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 may have a single-layer or multi-layer structure including the above material. In the case of the multi-layer structure, the substrate 100 may further include an inorganic layer.

The first area 1A includes the display area DA. As shown in FIGS. 2A and 2B, the first area 1A includes a portion of the non-display area NDA which is outside the display area DA, as well as the display area DA. The second area 2A also includes the non-display area NDA.

A plurality of pixels may be arranged in the display area DA of the substrate 100 to display an image. The display area DA may include devices such as thin film transistors (TFT), organic light-emitting devices (OLEDs), and capacitors.

The display area DA may further include signal wires for transmitting pulse signals, such as a gate line for transmitting a gate signal and a data line for transmitting a data signal, and signal wires for transmitting direct current signals, such as a driving power line and a common power line. A pixel may be formed by electric coupling of the TFT, the capacitor, the OLED, and the like, connected to the gate line, the data line, the driving power line, and the common power line and may display an image. The pixel may emit light at the brightness corresponding to a driving current passing through the OLED in response to the data signal according to driving power and common power supplied to the pixel. The signal wires may be connected to a driving circuit unit (not shown) connected to a terminal unit 20 via fan-out wires 210. That is, the fan-out wires 210 may transmit pulse signals such as the gate signal and the data signal and direct current such as power. The pixel may be a plurality of pixels that may be arranged in various forms, such as a stripe layout, a PenTile layout, or the like.

An encapsulation layer 400 may encapsulate the display area DA. The encapsulation layer 400 may cover the display device, etc. disposed in the display area DA and protect the display device, etc. from external moisture or oxygen. The encapsulation layer 400 may cover the display area DA and partially extend out of the display area DA.

A touchscreen layer 700 (see FIG. 6, for example) including a touch electrode 710 having various patterns to provide a touchscreen function is provided on the encapsulation layer 400. The touch electrode 710 includes first touch electrodes 710a connected to each other in a first direction (x direction) and second touch electrodes 710b connected to each other in a second direction (y direction) crossing the first direction.

The touch electrode 710 may include a transparent electrode material so as to transmit light emitted from an emission area of pixels disposed below the touchscreen layer 700. Alternatively, the touch electrode 710 may have a mesh shape so as to transmit light emitted from the emission area of pixels. In this case, the touch electrode 710 is not limited to the transparent electrode material. For example, the touch electrode 710 may include a single layer or a multilayer including a conductive material including aluminum (Al), copper (Cu) and/or titanium (Ti).

The touch electrode 710 may be connected to a touch wire 720 for transmitting a signal sensed by the touch electrode 710, and the touch wire 720 may extend from an upper portion of the encapsulation layer 400 to the non-display area NDA along a side surface of the encapsulation layer 400.

The terminal unit 20, a driving voltage supply line 30, and a wiring unit 40 may be disposed in the non-display area NDA. In addition, although not shown, a common power line, a gate driver, a data driver, etc. may be further disposed in the non-display area NDA.

The terminal unit 20 is disposed at an end portion of the non-display area NDA and includes a plurality of terminals 21, 22, and 23. The terminal unit 20 may be exposed without being covered by an insulation layer and thus may be electrically connected to a controller (not shown) such as a flexible printed circuit board or a driver IC. The controller may provide a data signal, a gate signal, a driving voltage ELVDD, a common voltage ELVSS, etc. In addition, the controller may provide a signal to the touchscreen layer 700 through the touch wire 720 or may receive a signal sensed in the touchscreen layer 700.

The driving voltage supply line 30 may be connected to the controller through the driving terminal 22 and may provide the driving voltage ELVDD provided from the controller to pixels. The driving voltage supply line 30 may be disposed in the non-display area NDA so as to cover a side surface of the display area DA.

A fan-out wire 210 is disposed in the non-display area NDA and is connected to a signal wire for applying an electric signal to the TFT or the display device disposed in the display area DA. As described above, the signal wire may correspond to various wires disposed in the display area DA, such as the gate line, the data line, the driving power line, or the common power line.

The fan-out wire 210 may include an inside wire 213i connected to signal wires of the display area DA, an outside wire 213o connected to the terminal unit 20 of the non-display area NDA, and a connection wire 215 for connecting the inside wire 213i and the outside wire 213o to each other.

The fan-out wire 210 may be at least partially disposed at the bending area BA. For example, the connection wire 215 of the fan-out wire 210 may overlap the bending area BA. In some embodiments, the fan-out wire 210 may extend from the first area 1A to the second area 2A across the bending area BA. That is, the fan-out wire 210 may extend crossing the bending axis BAX. For example, the fan-out wire 210 may be variously modified to extend at a predetermined angle with respect to the bending axis BAX. In addition, the fan-out wire 210 may have various shapes such as a curved shape or a zigzag shape other than a straight shape. The fan-out wire 210 may be connected to the driving terminal 21 of the terminal unit 20 and transmit an electric signal to the display area DA.

The inside wire 213i of the fan-out wire 210 may be disposed in the first area 1A so as to be located on a layer different from a layer on which the connection wire 215 is located, and may be connected to the connection wire 215 through a contact hole. The contact hole may be disposed between the display area DA and the bending area BA. Because the inside wire 213i is connected to signal wires electrically connected to the TFT, etc. in the display area DA, the fan-out wire 210 may be electrically connected to the TFT, etc. in the display area DA.

The outside wire 213o of the fan-out wire 210 may be disposed in the second area 2A so as to be located on a layer different from the layer on which the connection wire 215 is located, and may be connected to the connection wire 215 through a contact hole. The contact hole may be disposed between the bending area BA and the terminal unit 20. Because an end of the outside wire 213o is connected to the driving terminal 21 of the terminal unit 20, the fan-out wire 210 may transmit an electric signal of the controller connected to the terminal unit 20 to the display area DA.

An organic material layer 160 may be disposed mainly over the bending area BA, and thus, in the bending area BA, the organic material layer 160 may be disposed below the connection wire 215.

The fan-out wire 210 may include the inside wire 213i, the connection wire 215, and the outside wire 213o by taking into account a tensile stress, etc. occurring in the bending area BA.

The touch wire 720 may be connected to the touch electrode 710 of the touchscreen layer 700 of the display area DA, and may extend from the upper portion of the encapsulation layer 400 to be at least partially disposed at the bending area BA. In some embodiments, the touch wire 720 may extend from the first area 1A to the second area 2A across the bending area BA. That is, the touch wire 720 may extend crossing the bending axis BAX. For example, the touch wire 720 may have various modifications such as extending slanted at a predetermined angle with respect to the bending axis BAX. In addition, the touch wire 720 may have various shapes such as a curved shape or a zigzag shape other than a straight shape. The touch wire 720 may be connected to the touch terminal 22 of the terminal unit 20 and exchange electric signals with the touchscreen layer 700.

The touch wire 720 may be a continuous wire, and may extend from the display area DA, cross the bending area BA, and be connected to the terminal unit 20. That is, the touch wire 720 is not formed by connecting wires disposed on different layers to each other, and accordingly, may not include a contact hole between the display area DA and the bending area BA.

In the present embodiment, the touch wire 720 is a continuous wire extending from the display area DA to the terminal unit 20, and thus, an area of the contact hole is not needed. Accordingly, an area of the non-display area NDA may be reduced. This will be described with reference to FIGS. 4A to 5.

Figure 4A:
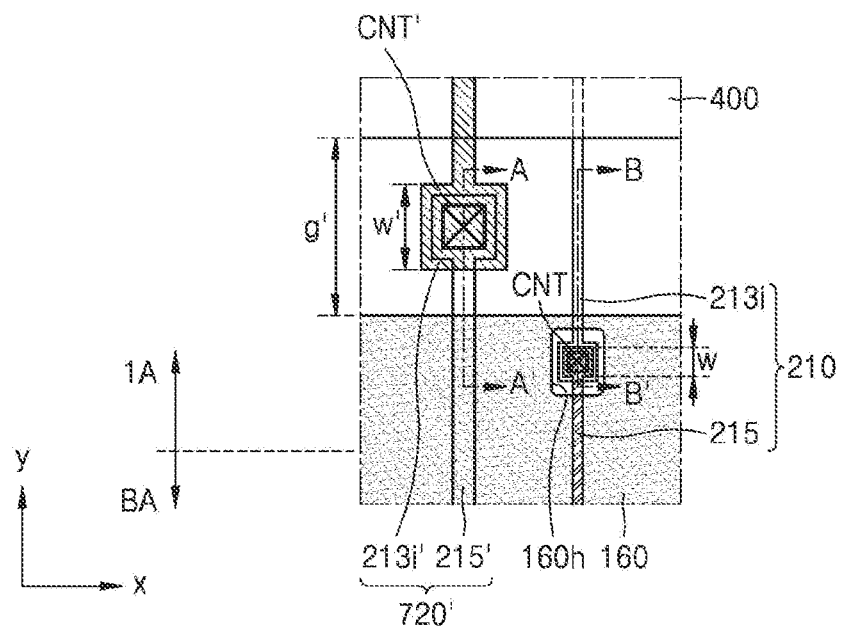
FIG. 4A is a schematic plan view of a portion of a display apparatus according to a comparison example.
Figure 4B:
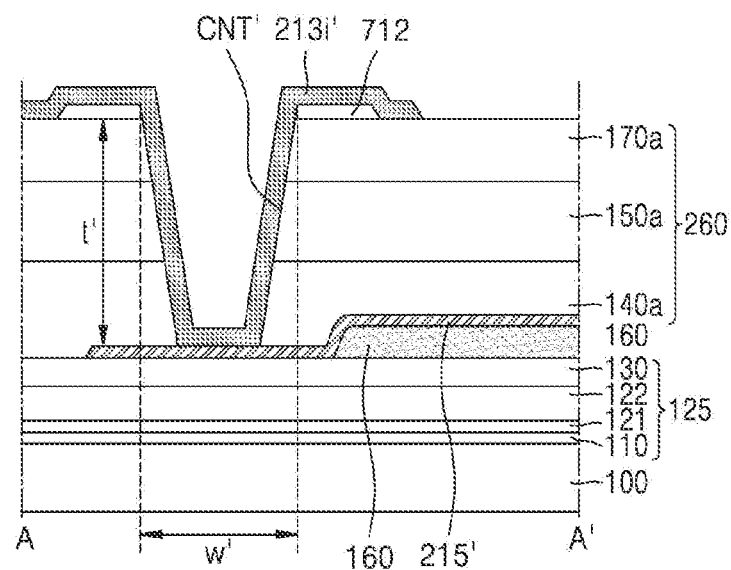
FIG. 4B is a cross-sectional view of the portion of the display apparatus of FIG. 4A taken along line A-A'.
Figure 4C:
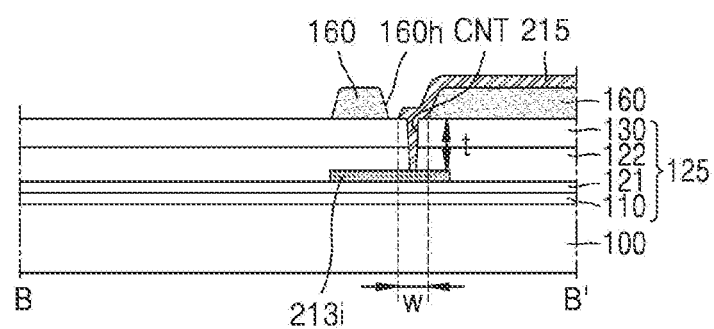
FIG. 4C is a cross-sectional view of the portion of the display apparatus of FIG. 4A taken along line B-B'.
Figure 5:
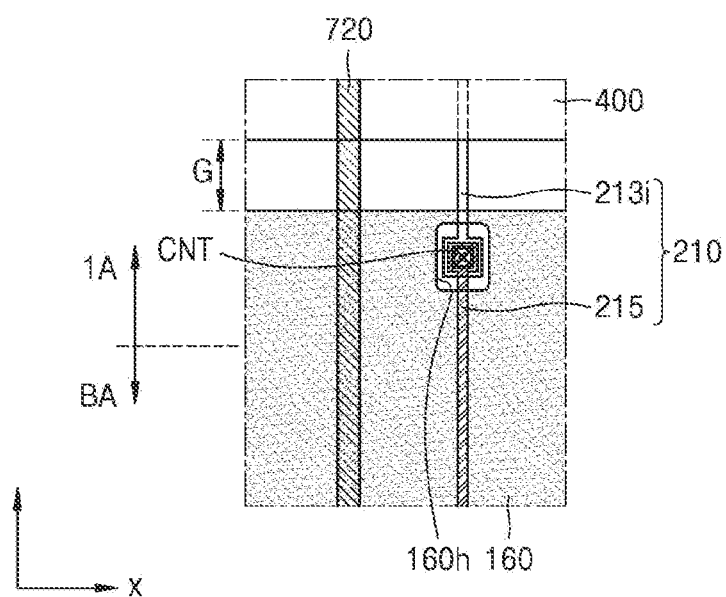
FIG. 5 is a schematic plan view of a portion of a display apparatus according to an embodiment.

FIG. 4A is a plan view of portions of a touch wire and a fan-out wire according to another embodiment that may be used as a comparison example. FIG. 4B is a cross-sectional view of the portions of the touch wire and the fan-out wire of FIG. 4A taken along line A-A'. FIG. 4C is a cross-sectional view of the portions of the touch wire and the fan-out wire of FIG. 4A taken along line B-B'. FIG. 5 is a plan view of portions of a touch wire and a fan-out wire according to an embodiment.

Referring to FIGS. 4A to 4C, a touch wire 720' according to the comparison example includes an inside-touch wire 213i' and a connection-touch wire 215' disposed on different layers from each other. The connection-touch wire 215' may be disposed on the same layer as the connection wire 215 of the fan-out wire 210 to decrease a stress due to bending.

An upper organic material layer 260 is disposed between the inside-touch wire 213i' and the connection-touch wire 215'. A second gate insulation layer 122 and an interlayer insulation layer 130 are disposed between the inside wire 213i and the connection wire 215 of the fan-out wire 210.

The side surfaces of contact holes CNT' and CNT may be angled (e.g. inclined), and thus, as a thickness of an insulation layer where the contact holes CNT' and CNT are defined increases, widths w' and w of the contact holes CNT' and CNT increase. A thickness t' of the upper organic material layer 260 may be much greater than a thickness t obtained by summing thicknesses of the second gate insulation layer 122 and the interlayer insulation layer 130, and thus, the width w' of the contact hole CNT' formed in the touch wire 720' may be much greater than the width w of the contact hole CNT formed in the fan-out wire 210. Accordingly, not forming the contact hole CNT' in the touch wire 720' may reduce an area of the non-display area NDA in a significant range.

Referring to FIG. 5, the touch wire 720 according to an embodiment extends from an upper portion of the encapsulation layer 400 to the bending area BA via an upper portion of the organic material layer 160. The fan-out wire 210 may include the inside wire 213i extending from a lower portion of the encapsulation layer 400 and the connection wire 215 connected to the inside wire 213i through the contact hole CNT. Although FIG. 5 shows the contact hole CNT disposed in an organic-through hole 160h defined in the organic material layer 160, one or more embodiments are not limited thereto. For example, the contact hole CNT may be disposed between the encapsulation layer 400 and the organic material layer 160.

Comparing FIG. 5 with FIG. 4A, it may be found that the contact hole CNT' is not included in the touch wire 720. Thus, a gap G between the encapsulation layer 400 and the bending area BA (of FIG. 5) may be reduced compared to a gap g' of FIG. 4A between the encapsulation layer 400 and the bending area BA.

The present embodiments provide various embodiments in which the contact hole CNT' is not formed in the touch wire 720, and thus, the non-display area NDA may be reduced and a tensile stress which may occur to the touch wire 720 at the bending area BA may be reduced. Hereinafter, these will be described in detail.

Figure 6:
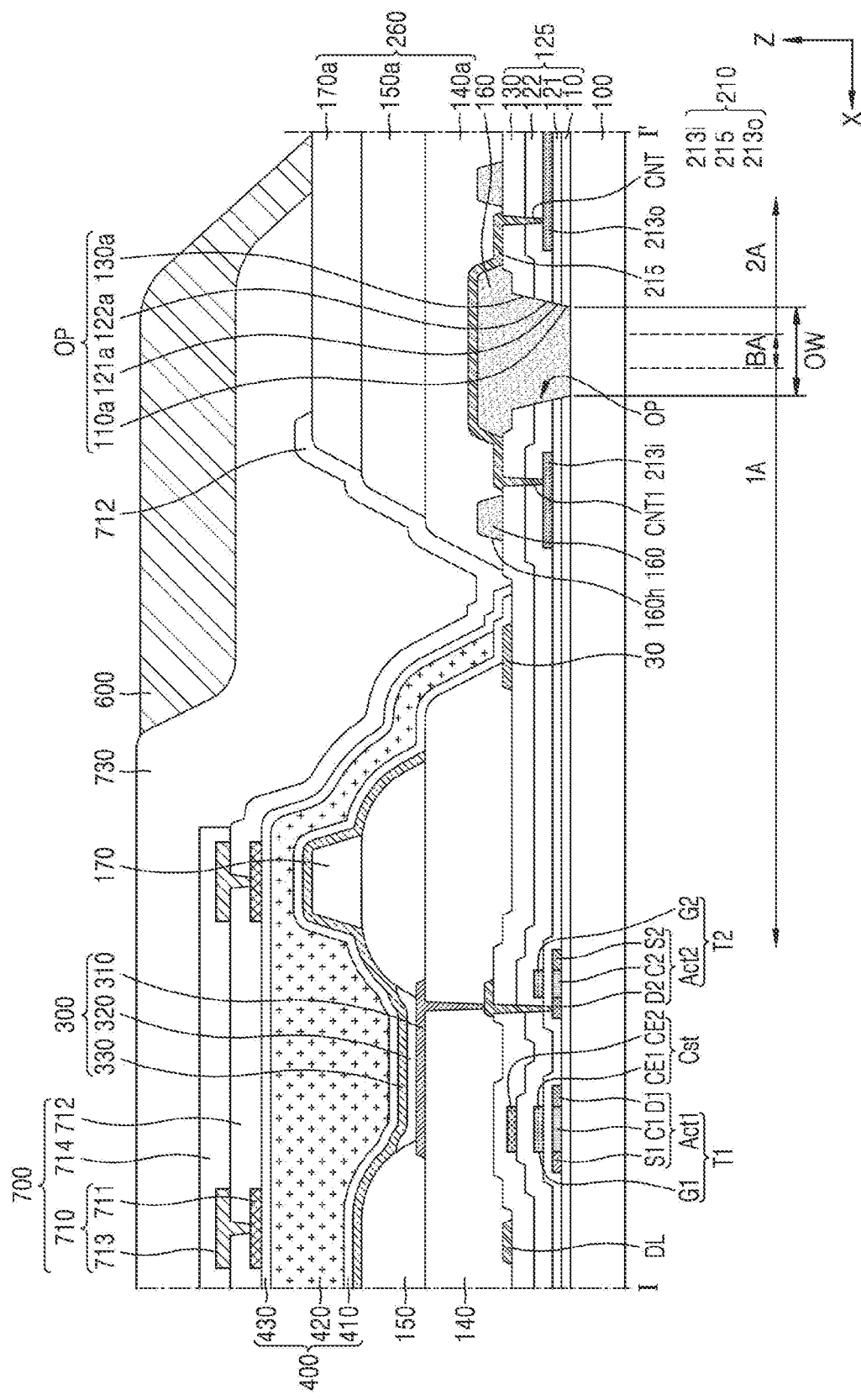
FIG. 6 is a schematic cross-sectional view of the portion of the display apparatus of FIG. 3 taken along line I-I'.
Figure 7:
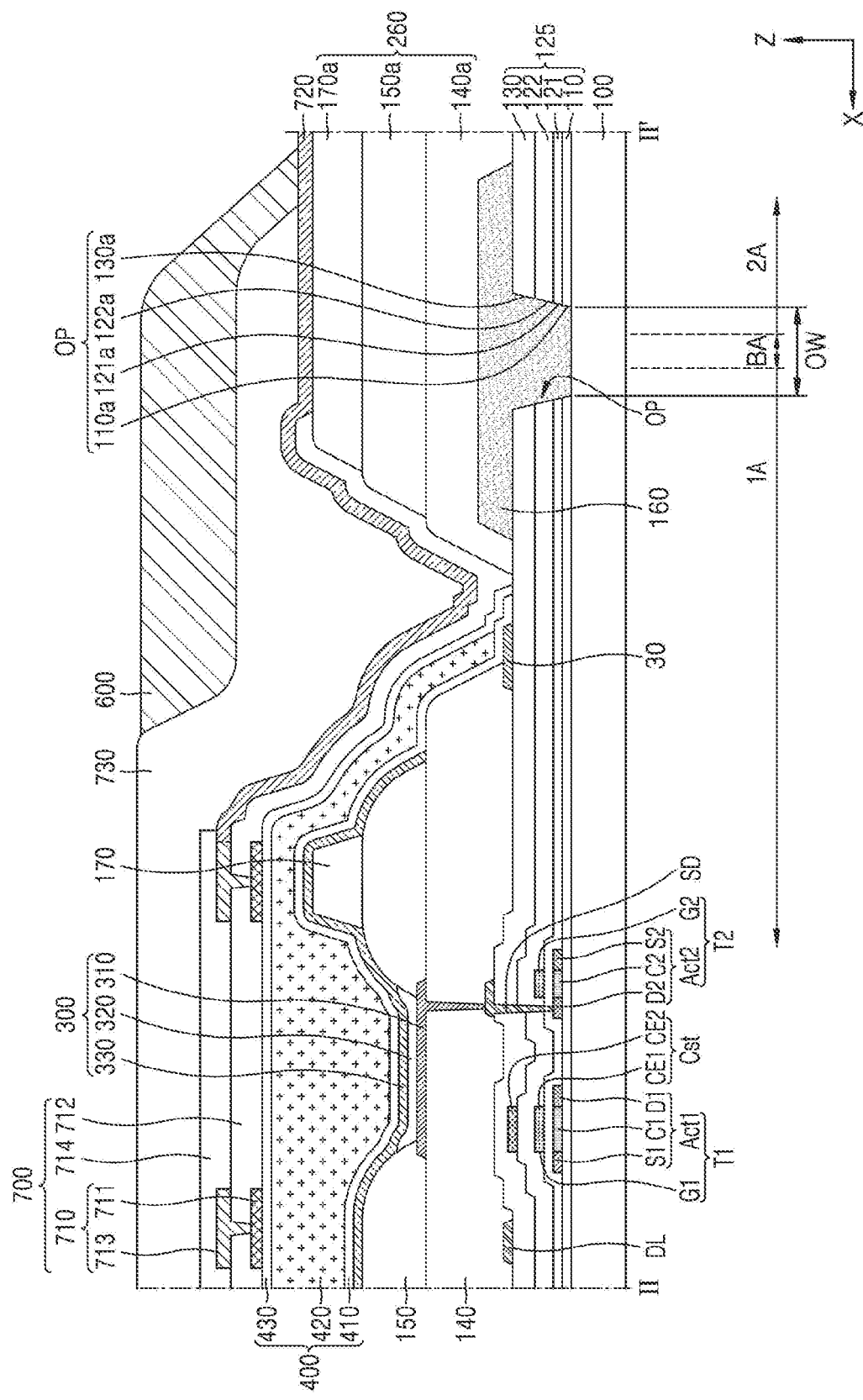
FIG. 7 is a schematic cross-sectional view of the portion of the display apparatus of FIG. 3 taken along line II-II'.

FIGS. 6 and 7 are schematic cross-sectional views of the display apparatus of FIG. 3, taken along lines I-I' and respectively. The line I-I' is a line taken along the fan-out wire 210 staring from the display area DA, and the line II-II' is a line taken along the touch wire 720 starting from the display area DA.

Referring to FIGS. 6 and 7, an OLED 300 is located in the display area DA as a display device. The OLED 300 electrically connected to a first TFT T1 or a second TFT T2 may be understood as a pixel electrode 310 electrically connected to the first or second TFT T1 or T2. If necessary, a TFT (not shown) may also be disposed in a peripheral area at the outside of the display area DA. The TFT located in the peripheral area may be, for example, a portion of a circuit unit for controlling an electric signal which is applied into the display area DA.

The first TFT T1 includes a first semiconductor layer Act1 and a first gate electrode G1, and the second TFT T2 includes a second semiconductor layer Act2 and a second gate electrode G2.

The first semiconductor layer Act1 and the second semiconductor layer Act2 may include amorphous silicon, polycrystalline silicon, an oxide semiconductor, or an organic semiconductor material. The first semiconductor layer Act1 includes a channel area C1, a source region S1 and a drain region D1. The source region S1 and the drain region D1 are disposed at opposite sides of the channel area C1. The second semiconductor layer Act2 also includes a channel area C2, with a source region S2, and a drain region D2 disposed at opposite sides of the channel area C2.

The first gate electrode G1 and the second gate electrode G2 respectively overlap the channel area C1 of the first semiconductor layer Act1 and the channel area C2 of the second semiconductor layer Act2 with a first gate insulation layer 121 therebetween. The first gate electrode G1 and the second gate electrode G2 may be connected to a gate line (not shown) for applying an on/off signal to the first TFT T1 and/or the second TFT T2 and may include a low-resistance metal material. For example, the first and second gate electrodes G1 and G2 may include a single layer or a multilayer including a conductive material including molybdenum (Mo), Al, Cu and/or Ti. Although FIGS. 6 and 7 show the first gate electrode G1 and the second gate electrode G2 disposed on the same layer as each other, one or more embodiments are not limited thereto. The first gate electrode G1 and the second gate electrode G2 may be disposed on different layers from each other.

The second TFT T2 may include a source electrode (not shown) and/or a drain electrode SD. The source electrode and the drain electrode SD may include a single layer or a multilayer including a highly conductive material, and may be respectively connected to the source region S2 and the drain region D2 of the second semiconductor layer Act2. For example, the source electrode and the drain electrode SD may include a single layer or a multilayer including a conductive material including Al, Cu and/or Ti. The first TFT T1 may also include a source electrode and a drain electrode respectively connected to the source region S1 and the drain region D1 of the first semiconductor layer Act1, but one or more embodiments are not limited thereto. Without a source electrode and a drain electrode additionally connected to the source region S1 and the drain region D1 of the first TFT T1, the source region S1 and the drain region D1 themselves may serve as the source electrode and the drain electrode.

The source electrode and/or the drain electrode SD may be connected to the second semiconductor layer Act2 through a contact hole. The contact hole may be formed by concurrently (e.g. simultaneously) etching the interlayer insulation layer 130, the second gate insulation layer 122, and the first gate insulation layer 121.

The first and second TFTs T1 and T2, according to an embodiment, are of a top gate type in which the first and second gate electrodes G1 and G2 are disposed above the first and second semiconductor layers Act1 and Act2, but one or more embodiments are not limited thereto. The first or second TFT T1 or T2, according to another embodiment, may be of a bottom gate type in which the first or second gate electrode G1 or G2 is disposed below the first and second semiconductor layers Act1 and Act2.

A storage capacitor Cst may overlap the first TFT T1. In this case, areas of the storage capacitor Cst and the first TFT T1 may be increased, and a high-quality image may be provided. For example, the first gate electrode G1 may be a first storage capacitor plate CE1 of the storage capacitor Cst. A second storage capacitor plate CE2 may overlap the first storage capacitor plate CE1 with the second gate insulation layer 122 therebetween. The second gate insulation layer 122 may include an inorganic insulating material such as silicon oxide (SiOx), silicon nitride (SiNx) and/or silicon oxynitride (SiON). According to another embodiment, the storage capacitor Cst may not overlap the first TFT T1.

In order to insulate the first and second semiconductor layers Act1 and Act2 from the first and second gate electrodes G1 and G2, the first gate insulation layer 121 including an inorganic material such as silicon oxide, silicon nitride and/or silicon oxynitride may be disposed between the first and second semiconductor layers Act1 and Act2 and the first and second gate electrodes G1 and G2.

The second gate insulation layer 122 including an inorganic insulating material such as silicon oxide, silicon nitride and/or silicon oxynitride may be disposed on the first and second gate electrodes G1 and G2, and the interlayer insulation layer 130 including an inorganic insulating material such as silicon oxide, silicon nitride and/or silicon oxynitride may be disposed on the second storage capacitor plate CE2.

The source electrode and the drain electrode SD may be disposed on the interlayer insulation layer 130. A data line DL may be disposed on the interlayer insulation layer 130, that is, on the same layer as the source electrode and the drain electrode SD, and be electrically connected to the source electrode or the drain electrode SD.

The insulating layer including an inorganic material as described above may be formed by chemical vapor deposition (CVD) or atomic layer deposition (ALD). The same goes for the following embodiments and modified examples thereof.

A buffer layer 110 including an inorganic material such as silicon oxide, silicon nitride and/or silicon oxynitride may be disposed between the first and second TFTs T1 and T2 having the above structure and the substrate 100. The buffer layer 110 may increase smoothness of an upper surface of the substrate 100 or may prevent or reduce permeation of impurities from the substrate 100, etc. into the first and second semiconductor layers Act1 and Act2. The buffer layer 110 may include an inorganic material such as oxide or nitride, an organic material, or an organic-inorganic compound, and may have a single-layer or multi-layer structure including an inorganic material and an organic material. In some embodiments, the buffer layer 110 may have a triple-layer structure of silicon oxide/silicon nitride/silicon oxide.

In addition, a planarization layer 140 may be disposed above the first and second TFTs T1 and T2 and the storage capacitor Cst. The planarization layer 140 covers the first and second TFTs T1 and T2 and the storage capacitor Cst. An upper surface of the planarization layer 140 may be substantially planarized. The planarization layer 140 may include an organic material such as acryl, benzocyclobutene (BCB), or hexamethyldisiloxane (HMDSO). Although FIGS. 6 and 7 show the planarization layer 140 as a single layer, the planarization layer 140 may have various modifications such as a multilayer.

In the display area DA of the substrate 100, the OLED 300 including a pixel electrode 310, an opposite electrode 330, and an intermediate layer 320 disposed therebetween and including an emission layer may be located on the planarization layer 140. The pixel electrode 310 may contact one of the source electrode and the drain electrode SD through an opening portion formed in the planarization layer 140, etc. and be electrically connected to the second TFT T2.

A pixel-defining layer 150 may be disposed on the planarization layer 140. The pixel-defining layer 150 includes an opening corresponding to each sub-pixel, that is, an opening exposing at least a central portion of the pixel electrode 310, and thus defines a pixel. In addition, the pixel-defining layer 150 may increase a distance between an edge of the pixel electrode 310 and the opposite electrode 330 above the pixel electrode 310, thereby preventing occurrence of an arc, etc. at the edge of the pixel electrode 310. The pixel-defining layer 150 may include an organic material, for example, PI or HMDSO.

A spacer 170 may be disposed on the pixel-defining layer 150. The spacer 170 may be used to prevent mask damage which may occur during the manufacture of a mask required to form the intermediate layer 320 of the OLED 300. The spacer 170 may include an organic material such as PI or HMDSO. The spacer 170 may be formed of the same material as and concurrently (e.g. simultaneously) with the pixel-defining layer 150. In this case, a halftone mask may be used.

The intermediate layer 320 of the OLED 300 may include a low-molecular weight or high-molecular weight material. When the intermediate layer 320 includes a low-molecular material, the intermediate layer 320 may have a structure in which a hole injection layer (HIL), a hole transport layer (HTL), an emission layer (EML), an electron transport layer (ETL), and an electron injection layer (EIL) are stacked in a single or complex structure, and may include various organic materials including copper phthalocyanine (CuPc), N, N'-Di(naphthalene-1-yl)-N, N'-diphenyl-benzidine (NPB), and tris-8-hydroxyquinoline aluminum (Alq3). These layers may be formed by vacuum deposition.

When the intermediate layer 320 includes a high-molecular weight material, the intermediate layer 320 may generally have a structure including an HTL and an EML. In this regard, the HTL may include PEDOT, and the EML may include a high-molecular weight material such as a polyphenylenevinylene (PPV)-based material or a polyfluorene-based material. The intermediate layer 320 may be formed by screen printing, inkjet printing, laser induced thermal imaging (LITI), or the like.

The intermediate layer 320 is not limited thereto and may have any of various other structures. The intermediate layer 320 may include a single layer that covers a plurality of pixel electrodes 310 or may include patterned layers respectively corresponding to the plurality of pixel electrodes 310.

The opposite electrode 330 is disposed over the display area DA, and may cover the display area DA. That is, the opposite electrode 330 may be formed as a single electrode for a plurality of OLEDs 300 to correspond to the plurality of pixel electrodes 310.

Because the OLED 300 may be easily damaged by external moisture or oxygen, the encapsulation layer 400 may cover and protect the OLED 300. The encapsulation layer 400 may cover the display area DA and extend out of the display area DA. The encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include ceramic, metal oxide, metal nitride, metal carbide, metal oxynitride, indium oxide ($In_2O_3$), tin oxide ($SnO_2$), indium tin oxide (ITO), silicon oxide, silicon nitride and/or silicon oxynitride. If necessary, other layers such as a capping layer may be disposed between the first inorganic encapsulation layer 410 and the opposite electrode 330. Because the first inorganic encapsulation layer 410 is formed along a structure therebelow, an upper surface of the first inorganic encapsulation layer 410 may not be flat as shown in FIGS. 6 and 7.

The organic encapsulation layer 420 may cover the first inorganic encapsulation layer 410. Unlike the first inorganic encapsulation layer 410, an upper surface of the organic encapsulation layer 420 may be substantially flat. In more detail, an upper surface of a portion of the organic encapsulation layer 420 corresponding to the display area DA may be substantially flat. The organic encapsulation layer 420 may include one or more materials selected from the group including acryl, metacrylic, polyester, polyethylene, polypropylene, PET, PEN, PC, PI, polyethylene sulfonate, polyoxymethylene, PAR, and HMDSO.

The second inorganic encapsulation layer 430 may cover the organic encapsulation layer 420 and may include ceramic, metal oxide, metal nitride, metal carbide, metal oxynitride, indium oxide ($In_2O_3$), tin oxide ($SnO_2$), ITO, silicon oxide, silicon nitride and/or silicon oxynitride. As shown in FIGS. 6 and 7, the second inorganic encapsulation layer 430 may contact the first inorganic encapsulation layer 410 at an edge thereof outside the display area DA, thereby preventing the organic encapsulation layer 420 from being externally exposed.

As described above, the encapsulation layer 400 includes the first inorganic encapsulation layer 410, the organic encapsulation layer 420, and the second inorganic encapsulation layer 430, and accordingly, even when cracks occur in the encapsulation layer 400, such a multi-layer structure may prevent the cracks from being connected to each other between the first inorganic encapsulation layer 410 and the organic encapsulation layer 420 or between the organic encapsulation layer 420 and the second inorganic encapsulation layer 430. Thus, formation of a path through which external moisture or oxygen permeates the display area DA may be prevented or reduced.

Although FIGS. 6 and 7 show the encapsulation layer 400 covering at least a portion of the driving voltage supply line 30, one or more embodiments are not limited thereto. For example, the encapsulation layer 400 may not cover the driving voltage supply line 30 but may cover only a portion corresponding to the display area DA.

The touchscreen layer 700 including the touch electrode 710 may be disposed on the encapsulation layer 400, and a cover layer 730 protecting the touchscreen layer 700 may be disposed on the touchscreen layer 700.

The touchscreen layer 700 may use, for example, a capacitance method in which a change in mutual capacitance which is formed between touch electrodes 710 of the touchscreen layer 700 during touch of the cover layer 730 occurs and the touchscreen layer 700 may determine contact with a corresponding portion by sensing the change. Alternatively, the touchscreen layer 700 may determine contact by using various methods such as a method in which a change in capacitance occurs between the touch electrode 710 and the opposite electrode 330 and the touchscreen layer 700 determines contact with a corresponding portion by sensing the change.

As shown in FIGS. 6 and 7, the touchscreen layer 700 according to an embodiment may have a structure in which a first touch conductive layer 711, a first insulation layer 712, a second touch conductive layer 713, and a second insulation layer 714 are sequentially stacked. The touch electrode 710 may include the first touch conductive layer 711 and the second touch conductive layer 713.

In some embodiments, the second touch conductive layer 713 may serve as a sensor for sensing contact, and the first touch conductive layer 711 may serve as a connector for connecting the patterned second touch conductive layer 713 in a direction.

In some embodiments, both of the first touch conductive layer 711 and the second touch conductive layer 713 may serve as a sensor. For example, the first insulation layer 712 may include a via hole exposing an upper surface of the first touch conductive layer 711, and the first touch conductive layer 711 and the second touch conductive layer 713 may be connected to each other through the via hole. As described above, as the first touch conductive layer 711 and the second touch conductive layer 713 are used, resistance of the touch electrode 710 may decrease, thereby increasing a response speed of the touchscreen layer 700.

In some embodiments, the touch electrode 710 may have a mesh structure through which light emitting from the OLED 300 may pass. Accordingly, the first touch conductive layer 711 and the second touch conductive layer 713 of the touch electrode 710 may not overlap an emission area of the OLED 300.

Each of the first touch conductive layer 711 and the second touch conductive layer 713 may include a single layer or a multilayer including a highly conductive material. For example, each of the first touch conductive layer 711 and the second touch conductive layer 713 may include a single layer or a multilayer including a conductive material including a transparent conductive layer, Al, Cu and/or Ti. The transparent conductive layer may include transparent conductive oxide such as ITO, indium zinc oxide (IZO), zinc oxide (ZnO), or indium tin zinc oxide (ITZO). In addition, the transparent conductive layer may include a conductive polymer such as PEDOT, metal nanowire, graphene, etc. In some embodiments, each of the first touch conductive layer 711 and the second touch conductive layer 713 may have a stack structure of Ti/Al/Ti.

Each of the first insulation layer 712 and the second insulation layer 714 may include an inorganic material or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may be at least one of acryl-based resin, methacryl-based resin, polyisoprene, vinyl-based resin, epoxy-based resin, urethane-based resin, cellulose-based resin, and perylene-based resin.

Although not shown, a touch buffer layer may be further provided between the encapsulation layer 400 and the touchscreen layer 700. The touch buffer layer may prevent damage to the encapsulation layer 400, and may block an interference signal which may be generated when the touchscreen layer 700 is driven. The touch buffer layer may include an inorganic material such as silicon oxide, silicon nitride, silicon oxynitride, aluminum oxide, aluminum nitride, titanium oxide, or titanium nitride, or an organic material such as PI, polyester, or acryl, and may include a stack including a plurality of materials from among the materials cited as examples.

The touch buffer layer and/or the touchscreen layer 700 are directly formed on the encapsulation layer 400 by deposition, etc., and thus, an additional adhesive layer on the encapsulation layer 400 is not required. Accordingly, a thickness of the display apparatus may be decreased.

The cover layer 730, which has flexibility, may include polymethyl methacrylate, polydimethylsiloxane, PI, acrylate, PET, PEN, etc. The cover layer 730 may be disposed on the touchscreen layer 700 to protect the touchscreen layer 700. As shown in FIGS. 6 and 7, the cover layer 730 may extend to the non-display area NDA. However, one or more embodiments are not limited thereto. The cover layer 730 may have various modifications such as being disposed only over the display area DA.

The buffer layer 110, the first gate insulation layer 121, the second gate insulation layer 122, and the interlayer insulation layer 130 including an inorganic material may be collectively referred to as an inorganic insulation layer 125. As shown in FIGS. 6 and 7, the inorganic insulation layer 125 may include an opening OP corresponding to the bending area BA. That is, the buffer layer 110, the first gate insulation layer 121, the second gate insulation layer 122, and the interlayer insulation layer 130 may respectively include openings 110a, 121a, 122a, and 130a corresponding to the bending area BA. The opening OP corresponding to the bending area BA may be understood as the opening OP overlapping the bending area BA. In this regard, an area of the opening OP may be larger than that of the bending area BA. FIGS. 6 and 7 show a width OW of the opening OP greater than that of the bending area BA. The area of the opening OP may be defined as an area of an opening, from among the openings 110a, 121a, 122a, and 130a of the buffer layer 110, the first gate insulation layer 121, the second gate insulation layer 122, and the interlayer insulation layer 130, having the smallest area, and FIGS. 6 and 7 show the area of the opening OP of the inorganic insulation layer 125 defined by an area of the opening 110a of the buffer layer 110.

FIGS. 6 and 7 show inner side surfaces of the opening 110a of the buffer layer 110 and the opening 121a of the first gate insulation layer 121 which are identical to each other, but one or more embodiments are not limited thereto. For example, an area of the opening 121a of the first gate insulation layer 121 may be larger than that of the opening 110a of the buffer layer 110.

The display apparatus according to the present embodiment may include the organic material layer 160 filling the opening OP of the inorganic insulation layer 125. That is, the organic material layer 160 may overlap the bending area BA. In addition, the organic material layer 160 may be disposed mainly over the bending area BA and extend to a portion of a non-bending area.

Also, the display apparatus according to the present embodiment includes the fan-out wire 210 including the connection wire 215. The connection wire 215 extends from the first area 1A to the second area 2A via the bending area BA and is located on the organic material layer 160. When the organic material layer 160 is not present, the connection wire 215 may be located on the inorganic insulation layer 125 such as the interlayer insulation layer 130. The connection wire 215 may serve as a wire for transmitting an electric signal to the display area DA, and may be formed of the same material as and concurrently with the source electrode and the drain electrode SD or the data line DL.

As described above, although FIGS. 6 and 7 show the display apparatus that is not bent for convenience, the display apparatus according to the present embodiment actually has the substrate 100, etc. bent at the bending area BA as shown in FIG. 1. To this end, during manufacturing processes, the display apparatus is manufactured such that substrate 100 is substantially flat as shown in FIGS. 6 and 7, and then, the substrate 100, etc. are bent at the bending area BA so that the display apparatus may substantially have the shape shown in FIG. 1. In this regard, although a tensile stress may be applied to the connection wire 215 during a process of bending the substrate 100, etc. at the bending area BA, in the case of the display apparatus according to the present embodiment, occurrence of defects in the connection wire 215 during the bending process may be prevented or reduced.

In some embodiments, the inorganic insulation layer 125 does not have the opening OP at the bending area BA and thus has a continuous shape extending from the first area 1A to the second area 2A. In these embodiments, the connection wire 215 may be located on the interlayer insulation layer 125 and a high tensile stress may be applied to the connection wire 215 during a process of bending the substrate 100, etc. In particular, because the inorganic insulation layer 125 is harder than the organic material layer 160, a crack, etc. may occur in the inorganic insulation layer 125 at the bending area BA, and when the inorganic insulation layer 125 has a crack, the connection wire 215 on the inorganic insulation layer 125 may also have a crack, etc., thereby causing a defect such as a short-circuit of the connection wire 215.

However, in the display apparatus according to the present embodiment, as described above, the inorganic insulation layer 125 has the opening OP at the bending area BA, and the connection wire 215 is located on the organic material layer 160 filling the opening OP. That is, at the bending area BA, the organic material layer 160 may be disposed between the substrate 100 and the connection wire 215.

Because the inorganic insulation layer 125 has the opening OP at the bending area BA, the inorganic insulation layer 125 is less likely to have a crack, etc., and the organic material layer 160 includes an organic material and thus is less likely to have a crack. Accordingly, occurrence of a crack, etc. in the connection wire 215 located on the organic material layer 160 may be prevented, or an incidence thereof may be reduced. That is, because the organic material layer 160 is more flexible than an inorganic material layer, the organic material layer 160 may absorb a tensile stress caused by bending the substrate 100, etc., thereby effectively reducing concentration of the tensile stress on the connection wire 215.

The organic material layer 160 may include one or more materials selected from the group including acryl, metacrylic, polyester, polyethylene, polypropylene, PET, PEN, PC, PI, polyethylene sulfonate, polyoxymethylene, PAR, and HMDSO.

In addition, the organic material layer 160 according to the present embodiment may be separate from a layer including an organic material included in the display area DA. For example, as shown in FIGS. 6 and 7, the organic material layer 160 may be separate from the planarization layer 140, the pixel-defining layer 150, and the spacer 170 included in the display area DA.

In addition, the organic material layer 160 according to the present embodiment may be separate from at least one organic encapsulation layer 420 included in the encapsulation layer 400. Although FIGS. 6 and 7 show the first inorganic encapsulation layer 410 and the second inorganic encapsulation layer 430 that are also separate from the organic material layer 160, one or more embodiments are not limited thereto. For example, a portion of the first inorganic encapsulation layer 410 or the second inorganic encapsulation layer 430 of the encapsulation layer 500 may contact the organic material layer 160.

The fan-out wire 210 according to the present embodiment includes the inside wire 213i and the outside wire 213o connected to the connection wire 215 in addition to the connection wire 215. The inside wire 213i and the outside wire 213o may be disposed in the first area 1A or the second area 2A so as to be located on a layer different from a layer on which the connection wire 215 is located, and may be electrically connected to the connection wire 215.

FIG. 6 shows the inside wire 213i located in the first area 1A and the outside wire 213o located in the second area 2A. In addition, FIG. 6 shows the inside wire 213i and the outside wire 213o are constructed of a material that is the same as that of the first gate electrode G1, and located on the same layer as the first gate electrode G1, that is, on the first gate insulation layer 121.

The connection wire 215 may contact the inside wire 213i and the outside wire 213o through the organic through hole 160h formed in the organic material layer 160 and the contact hole CNT penetrating the interlayer insulation layer 130 and the second gate insulation layer 122. The organic through hole 160h exposes an upper surface of the inorganic insulation layer 125 and includes the contact hole CNT. Although FIG. 6 shows one contact hole CNT disposed in one organic through hole 160h, one or more embodiments are not limited thereto. A plurality of contact holes CNT may be disposed in the one organic through hole 160h.

The inside wire 213i located in the first area 1A may be electrically connected to the first and second TFTs T1 and T2, etc. within the display area DA, and accordingly, the connection wire 215 may be electrically connected to the first and second TFTs T1 and T2 and/or the data line DL within the display area DA through the inside wire 213i. The inside wire 213i may be connected to a conductive layer disposed on a different layer than the inside wire 213i in the display area DA, for example, a conductive layer disposed on the interlayer insulation layer 130 or a conductive layer disposed on the second gate insulation layer 122, through the contact hole CNT1.

The outside wire 213o located in the second area 2A may also be electrically connected to the first and second TFTs T1 and T2 and/or the data line DL within the display area DA by the connection wire 215. The outside wire 213o may be connected to a conductive layer disposed on a different layer than the outside wire 213o in the second area 2A, for example, a conductive layer disposed on the interlayer insulation layer 130 or a conductive layer disposed on the second gate insulation layer 122, through the contact hole CNT2.

Likewise, the inside wire 213i and the outside wire 213o may be located outside the display area DA and be electrically connected to elements located in the display area DA, or may be located outside the display area DA and extend toward the display area DA and thus may be at least partially located in the display area DA.

As described above, in the display apparatus according to the present embodiment, a tensile stress may be applied to elements located in the bending area BA during a process of bending the substrate 100, etc. at the bending area BA.

Accordingly, the connection wire 215 extending across the bending area BA may include a material having a high elongation so that a crack in the connection wire 215 or a defect such as a short-circuit of the connection wire 215 may be prevented. Further, the inside wire 213i and the outside wire 213o are formed in the first area 1A, the second area 2A, or the like by using a material having a lower elongation than the connection wire 215, but having different electric/physical properties from the connection wire 215, and thus, efficiency of electric signal transmission in the display apparatus may increase or an incidence of defects during manufacturing processes may decrease. For example, the inside wire 213i and the outside wire 213o may include molybdenum, and the connection wire 215 may include aluminum. If necessary, the connection wire 215 or the inside wire 213i and the outside wire 213o may have a multi-layer structure. An end of the outside wire 213o located in the second area 2A may be externally exposed and be electrically connected to various types of electronic devices, a printed circuit board, or the like.

In some embodiments, the organic material layer 160 may extend to a contact area where the connection wire 215 and the inside wire 213i and the outside wire 213o are connected to each other. Next, the organic through hole 160h is formed in the organic material layer 160 so that the connection wire 215 and the inside wire 213i and the outside wire 213o may be connected to each other through the organic through hole 160h. That is, the connection wire 215 is connected to the inorganic insulation layer 125 through the organic through hole 160h, and thus, a short-circuit with another adjacent connection wire 215, which is caused by a conductive material that may remain during a process of patterning the connection wire 215 may be prevented.

The inside wire 213i and/or the outside wire 213o may be disposed on the second gate insulation layer 122. In this case, the inside wire 213i and/or the outside wire 213o may be formed of the same material as and concurrently with the storage capacitor plate CE2. In addition, various modifications may be made, for example, the inside wire 213i may be disposed on the first gate insulation layer 121 and the outside wire 213o may be disposed on the second gate insulation layer 122.

The upper organic material layer 260 may be disposed on the connection wire 215. The upper organic material layer 260 may be used as a member for supporting an open mask which is used to form a member generally deposited over the display area DA. For example, the upper organic material layer 260 may support an open mask which is used to deposit the opposite electrode 330, the first inorganic encapsulation layer 410, or the second inorganic encapsulation layer 430. Further, the upper organic material layer 260 may adjust a stress neutral plane in the bending area BA.

For example, when a stack is bent, a stress neutral plane exists in the stack. If the upper organic material layer 260, etc. is not on the connection wire 215, an excessive tensile stress, etc. may be applied to the connection wire 215 in the bending area BA as the substrate 100, etc. is bent. This is because a location of the connection wire 215 may not correspond to the stress neutral plane. However, as the stress neutral plane is located near the connection wire 215 by allowing the upper organic material layer 260, a bending protection layer (BPL) 600 described below, etc. to exist and adjusting a thickness, a modulus, etc. thereof, a tensile stress applied to the connection wire 215 may be reduced.

Referring to FIG. 7, in this embodiment, because the upper organic material layer 260 is disposed between the touch wire 720 and the substrate 100, a crack in the touch wire 720 may be prevented. That is, the upper organic material layer 260 absorbs a tensile stress due to bending and thus may effectively reduce concentration of the tensile stress on the touch wire 720.

The upper organic material layer 260 may include multiple organic material layers. For example, the upper organic material layer 260 may include at least one of a first upper organic material layer 140a, a second upper organic material layer 150a, and a third upper organic material layer 170a. That is, the upper organic material layer 260 may have a single-layer structure including each of the first upper organic material layer 140a, the second upper organic material layer 150a, and the third upper organic material layer 170a, and may have various modifications such as including only two of the first upper organic material layer 140a, the second upper organic material layer 150a, and the third upper organic material layer 170a.

When the upper organic material layer 260 is multilayered, each layer may form a step with respect to each other. That is, a side surface of the upper organic material layer 260 has a step shape, and thus, the touch wire 720 disposed at the side surface of the upper organic material layer 260 may extend, with a gentle slope, to an upper surface of the upper organic material layer 260.

The first upper organic material layer 140a may be formed of the same material as and concurrently (e.g. simultaneously) with the planarization layer 140. For example, the first upper organic material layer 140a may include an organic material such as PI, acryl, BCB, or HMDSO. The first upper organic material layer 140a is physically separate from the planarization layer 140 in order to prevent external impurities, etc. from reaching the inside of the display area DA through the inside of the planarization layer 140.

The second upper organic material layer 150a may be formed of the same material as and concurrently with the pixel-defining layer 150, and the third upper organic material layer 170a may be formed of the same material as and concurrently with the spacer 170. For example, the second upper organic material layer 150a and the third upper organic material layer 170a may include an organic material such as PI, acryl, BCB, or HMDSO. The second upper organic material layer 150a is physically separate from the pixel-defining layer 150, and the third upper organic material layer 170a is physically separate from the spacer 170.

Referring to FIG. 7, the touch wire 720 may be connected to the touch electrode 710 and may extend from an upper portion of the encapsulation layer 400 to the non-display area along a side surface of the encapsulation layer 400. The touch wire 720 may be connected to the touchscreen layer 700 and may extend from the upper portion of the encapsulation layer 400 and be at least partially disposed at the bending area BA. In some embodiments, the touch wire 720 may be disposed across the bending area BA. The touch wire 720 extends from an upper portion of the encapsulation layer 400 along a side surface of the encapsulation layer 400. In this regard, the side surface of the encapsulation layer 400 at which the touch wire 720 is disposed may have a curve. The curve may be formed as the planarization layer 140, the pixel-defining layer 150 and/or the spacer 170 form a step with respect to each other. By the curve, the touch wire 720 may be extended, with a gentle slope, from the upper portion of the encapsulation layer 400 to a non-encapsulation area.

The touch wire 720 may be formed of the same material as and concurrently (e.g. simultaneously) with the second touch conductive layer 713. In this case, at the non-display area NDA, the first insulation layer 712 may be at least partially disposed under the touch wire 720. The first insulation layer 712 may extend from an upper portion of the encapsulation layer 400 to an area before the bending area BA. However, one or more embodiments are not limited thereto. The first insulation layer 712 may have various modifications such as being not disposed at the non-display area NDA and extending to an end of the encapsulation layer 400.

The touch wire 720 may be formed of the same material as and concurrently with the first touch conductive layer 711. The touch wire 720 may include a single layer or a multi-layer including a conductive material including a transparent conductive layer, Al, Cu and/or T1.

As described above, in the present embodiment, the touch wire 720 is extended from the display area DA and disposed across the bending area BA by one continuous wire.

Accordingly, like the connection wire 215, the touch wire 720 extending across the bending area BA may include a material with a high elongation to prevent occurrence of a crack in the touch wire 720 or a defect such as a short-circuit of the touch wire 720. The touch wire 720 may include Al. In some embodiments, the touch wire 720 may include Ti/Al/Ti.

Even when the touch wire 720 includes the same material as the connection wire 215, properties of the touch wire 720 may be different from those of the connection wire 215. The touch wire 720 may be formed after the OLED 300 and thus may be formed through a low-temperature film-forming process. For example, the touch wire 720 may be formed through a low-temperature film-forming process of about 90 degrees Celsius or less.

On the other hand, the data line DL, the source electrode and the drain electrode SD, the connection wire 215, and the like are formed before the OLED 300, the encapsulation layer 400, or the like and may be formed through a high-temperature film-forming process of 90 degrees Celsius or greater, for example, 150 degrees Celsius or so.

Accordingly, even when the touch wire 720 includes the same material as the data line DL, the source electrode and the drain electrode SD, and the connection wire 215, a resistivity value or a grain size of the touch wire 720 may be different from that of the data line DL, the source electrode and the drain electrode SD, and the connection wire 215. For example, in a case of being formed of the same material, a resistivity value of the touch wire 720 may be about 25% greater than that of the connection wire 215. In this case, a grain size of the touch wire 720 may be less than that of the connection wire 215.

The organic material layer 160 and/or the upper organic material layer 260 may absorb a tensile stress which may occur during bending, thereby effectively reducing concentration of the tensile stress on the touch wire 720 because the organic material layer 160 and/or the upper organic material layer 260 are disposed between the substrate 100 and the touch wire 720 at the bending area BA.

Over the touch wire 720 and the connection wire 215, the BPL 600 may be formed above the substrate 100 so as to overlap the bending area BA. The BPL 600 may correspond to at least the bending area BA and be located over the touch wire 720 and the connection wire 215.

When a stack is bent, a stress neutral plane exists in the stack. Without the BPL 600, as described below, an excessive tensile stress, etc. may be applied to the touch wire 720 and the connection wire 215 in the bending area BA as the substrate 100, etc. are bent later. This is because a location of the touch wire 720 and the connection wire 215 may not correspond to the stress neutral plane. However, by allowing the BPL 600 to exist and adjusting a thickness, a modulus, etc. thereof, a location of the stress neutral plane may be adjusted for a stack including all of the substrate 100, the touch wire 720, the connection wire 215, the BPL 600, and the like.

Accordingly, by locating the stress neutral plane near the connection wire 215 and the touch wire 720 through the BPL 600, a tensile stress applied to the connection wire 215 and the touch wire 720 may be reduced, and thus, the bending area BA may be protected. For example, the stress neutral plane may be adjusted by the BPL 600 so as to be disposed near the connection wire 215, the touch wire 720, or between the connection wire 215 and the touch wire 720. The BPL 600 may be formed by applying and curing a material in a liquid or paste form.

Figure 8:
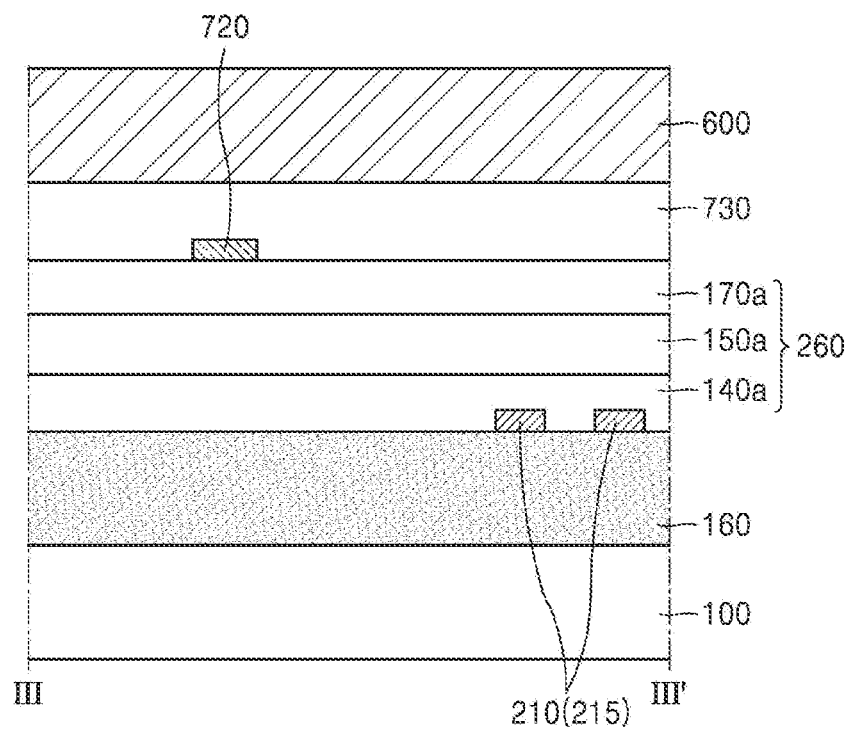
FIG. 8 is a schematic cross-sectional view of the portion of the display apparatus of FIG. 3 taken along line III-III'.

FIG. 8 is a schematic cross-sectional view of FIG. 3, taken along line III-III'. FIG. 8 shows a location relationship between the touch wire 720 and the fan-out wire 210 at the bending area BA.

Referring to FIG. 8, at the bending area BA, the touch wire 720 and the connection wire 215 of the fan-out wire 210 may be disposed on different layers from each other. That is, the organic material layer 160 and the upper organic material layer 260 may be provided between the touch wire 720 and the substrate 100, and the organic material layer 160 may be disposed between the connection wire 215 and the substrate 100. Accordingly, the upper organic material layer 260 may be provided between the fan-out wire 210 and the touch wire 720.

In other words, at the bending area BA, the shortest distance from an upper surface of the substrate 100 to the touch wire 720 may be greater than the shortest distance from the upper surface of the substrate 100 to the fan-out wire 210.

Although FIG. 8 shows the upper organic material layer 260 in which the first upper organic material layer 140a, the second upper organic material layer 150a, and the third upper organic material layer 170a are stacked, as described above, the upper organic material layer 260 may include at least one of the first upper organic material layer 140a, the second upper organic material layer 150a, and the third upper organic material layer 170a.

That is, the upper organic material layer 260 may have a single-layer structure including each of the first upper organic material layer 140a, the second upper organic material layer 150a, and the third upper organic material layer 170a, and may have various modifications such as including only two of the first upper organic material layer 140a, the second upper organic material layer 150a, and the third upper organic material layer 170a.

In addition, although FIG. 8 shows the cover layer 730 covering the touch wire 720, the cover layer 730 may not extend to the bending area BA. A thickness of the BPL 600 may be adjusted to dispose a stress neutral plane at the connection wire 215, the touch wire 720, or between the connection wire 215 and the touch wire 720.

Figure 9:
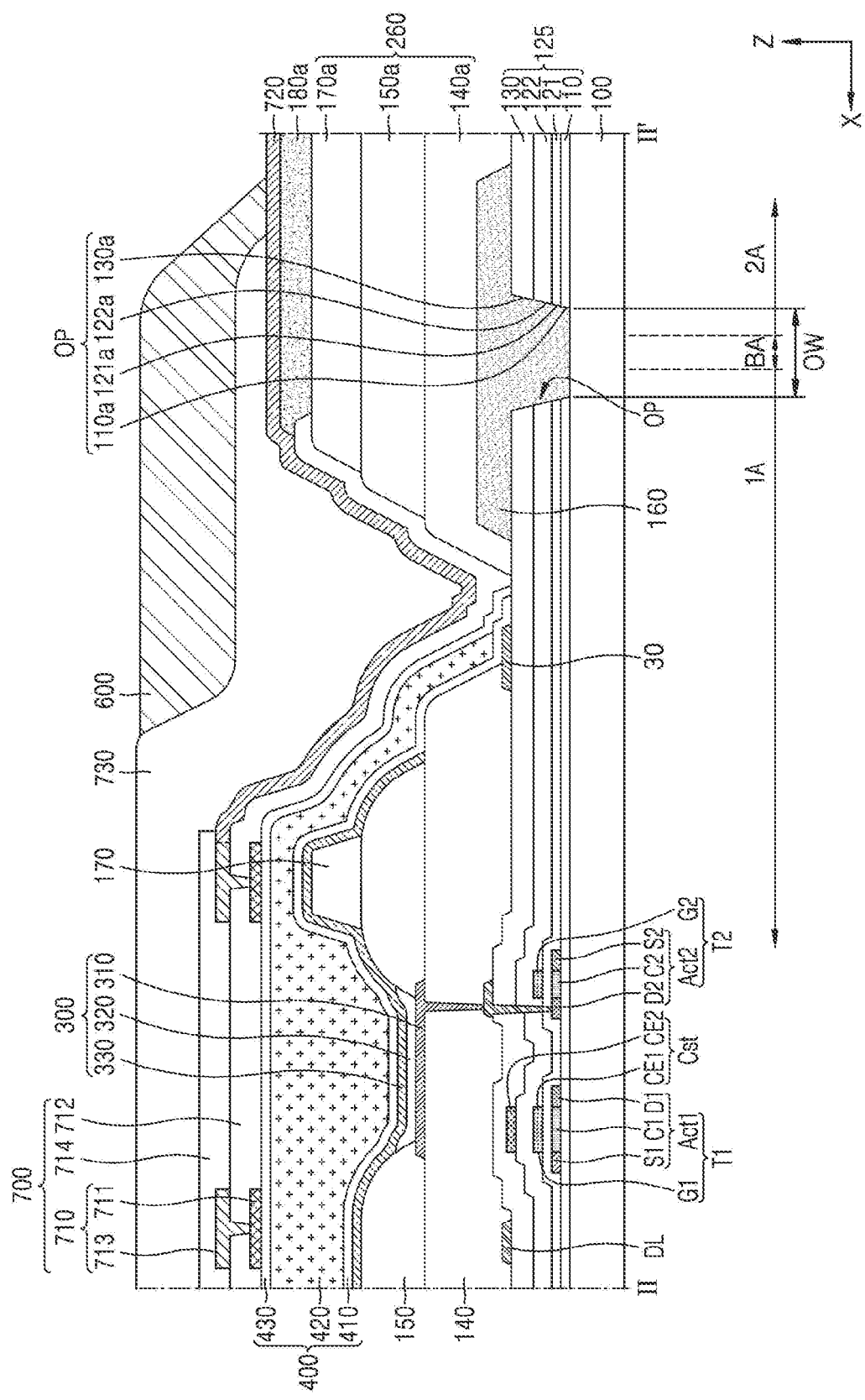
FIG. 9 is a schematic cross-sectional view of a portion of a display apparatus according to another embodiment.
Figure 10:
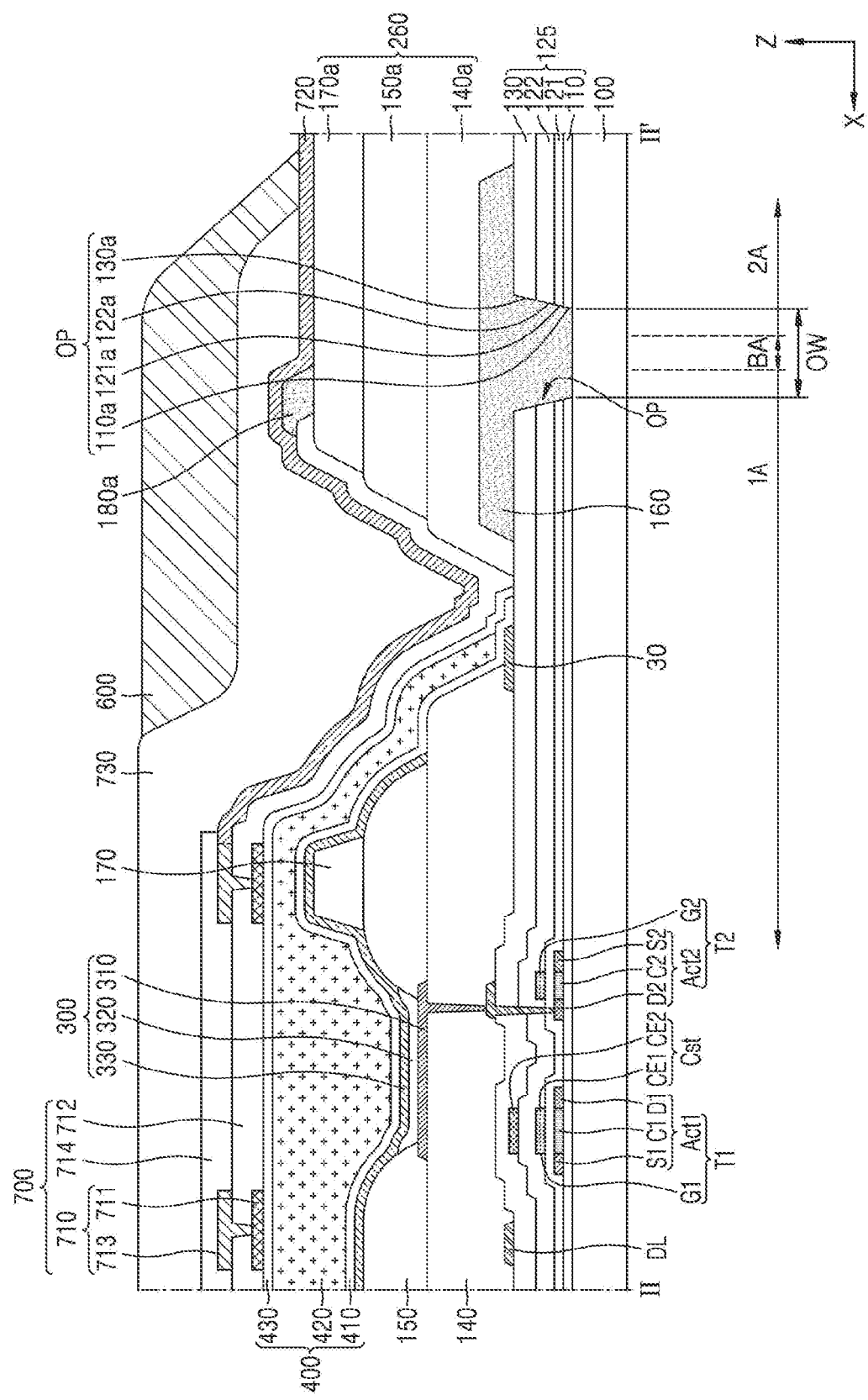
FIG. 10 is a schematic cross-sectional view of a portion of a display apparatus according to another embodiment.
Figure 11:
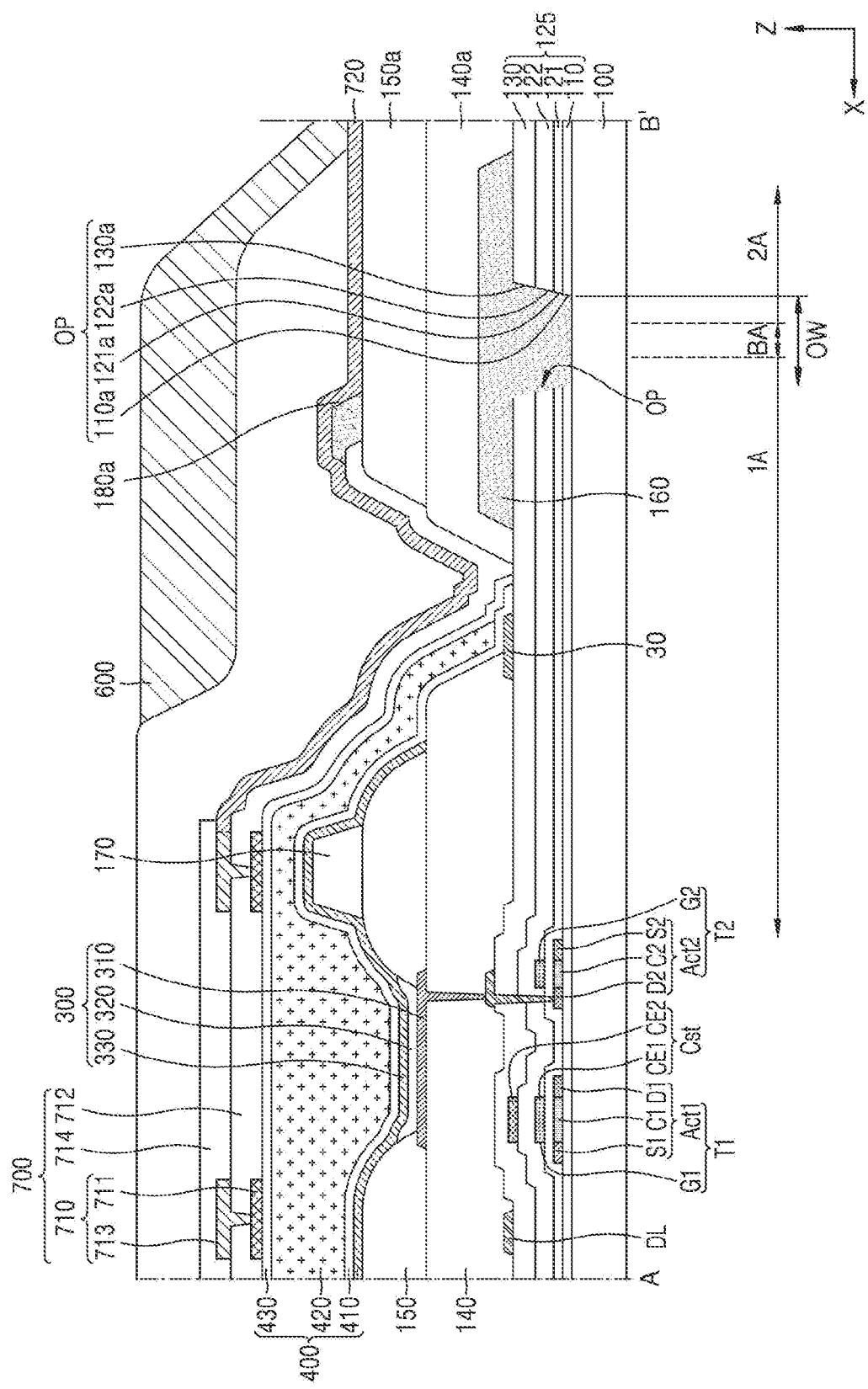
FIG. 11 is a schematic cross-sectional view of a portion of a display apparatus according to another embodiment.

Each of FIGS. 9 to 11 is a schematic cross-sectional view of a display apparatus according to another embodiment. In FIGS. 9 and 10, parts or components that are the same as those in FIG. 7 are designated by the same reference numerals, and thus, a repeated description thereof is omitted.

Referring to FIG. 9, the first insulation layer 712 extends from an upper portion of the encapsulation layer 400 to an upper surface of the third upper organic material layer 170a in a non-display area, and an additional organic material layer 180a covers an end of the first insulation layer 712.

When the first insulation layer 712 includes an inorganic layer, the first insulation layer 712 may crack when disposed at the bending area BA, and external moisture or oxygen may permeate a display area along the crack. Accordingly, when the first insulation layer 712 includes an inorganic layer, it is desirable that the first insulation layer 712 extends to an area before the bending area BA. The first insulation layer 712 disposed at the bending area BA may be removed by etching. In this regard, a residual remains at an end of the remaining first insulation layer 712, the residual may cause a defect to the touch wire 720 formed at an upper portion thereof.

Accordingly, the additional organic material layer 180a may cover the end of the first insulation layer 712 and remove a defect factor due to the residual. In addition, the additional organic material layer 180a is disposed at the bending area BA and thus may absorb a tensile stress applied to the touch wire 720 during bending.

The additional organic material layer 180a may include one or more materials selected from the group including acryl, metacrylic, polyester, polyethylene, polypropylene, PET, PEN, PC, PI, polyethylene sulfonate, polyoxymethylene, PAR, and HMDSO.

Referring to FIG. 10, the additional organic material layer 180a may cover an end of the first insulation layer 712 but may be partially disposed or may not be disposed at the bending area BA. The reason is that, even when the additional organic material layer 180a is not disposed at the bending area BA, the upper organic material layer 260 may absorb a tensile stress applied to the touch wire 720.

Referring to FIG. 11, in the present embodiment, the upper organic material layer 260 includes the first upper organic material layer 140a and the second upper organic material layer 150a. The first insulation layer 712 may extend to an upper surface of the second upper organic material layer 150a, and on the second upper organic material layer 150a, the additional organic material layer 180a may cover an end of the first insulation layer 712.

Although the additional organic material layer 180a may cover the end of the first insulation layer 712 and partially overlap the bending area BA, one or more embodiments are not limited thereto. The additional organic material layer 180a may have various modifications such as entirely overlapping the bending area BA and being not disposed at the bending area BA.

Figure 12:
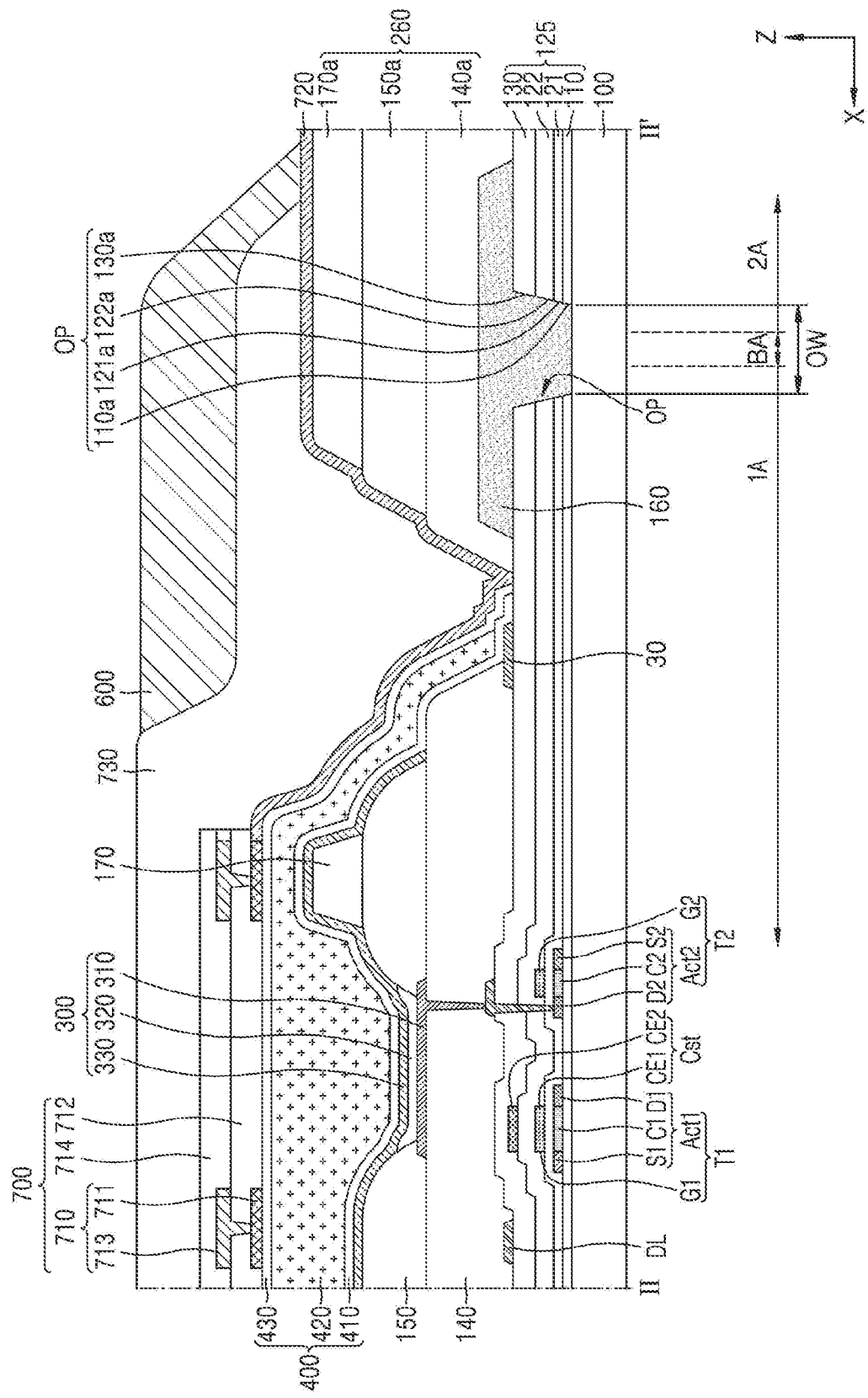
FIG. 12 is a schematic cross-sectional view of a portion of a display apparatus according to another embodiment.

FIG. 12 is a schematic cross-sectional view of a display apparatus according to another embodiment. In FIG. 12, parts or components that are the same as those in FIG. 7 are designated by the same reference numerals, and thus, a repeated description thereof is omitted.

Referring to FIG. 12, the touch wire 720 may be formed of the same material and on the same layer as the first touch conductive layer 711 and may extend from an upper portion of the encapsulation layer 400 to a non-display area along a side surface of the encapsulation layer 400. The touch wire 720 may extend from the upper portion of the encapsulation layer 400 and be disposed across the bending area BA. When the touch wire 720 is formed of the same material and on the same layer as the first touch conductive layer 711, the first insulation layer 712 (refer to FIG. 7) may not be disposed between the upper organic material layer 260 and the touch wire 720. The touch wire 720 may include a single layer or a multilayer including a conductive material including a transparent conductive layer, Al, Cu and/or Ti.

Figure 13:
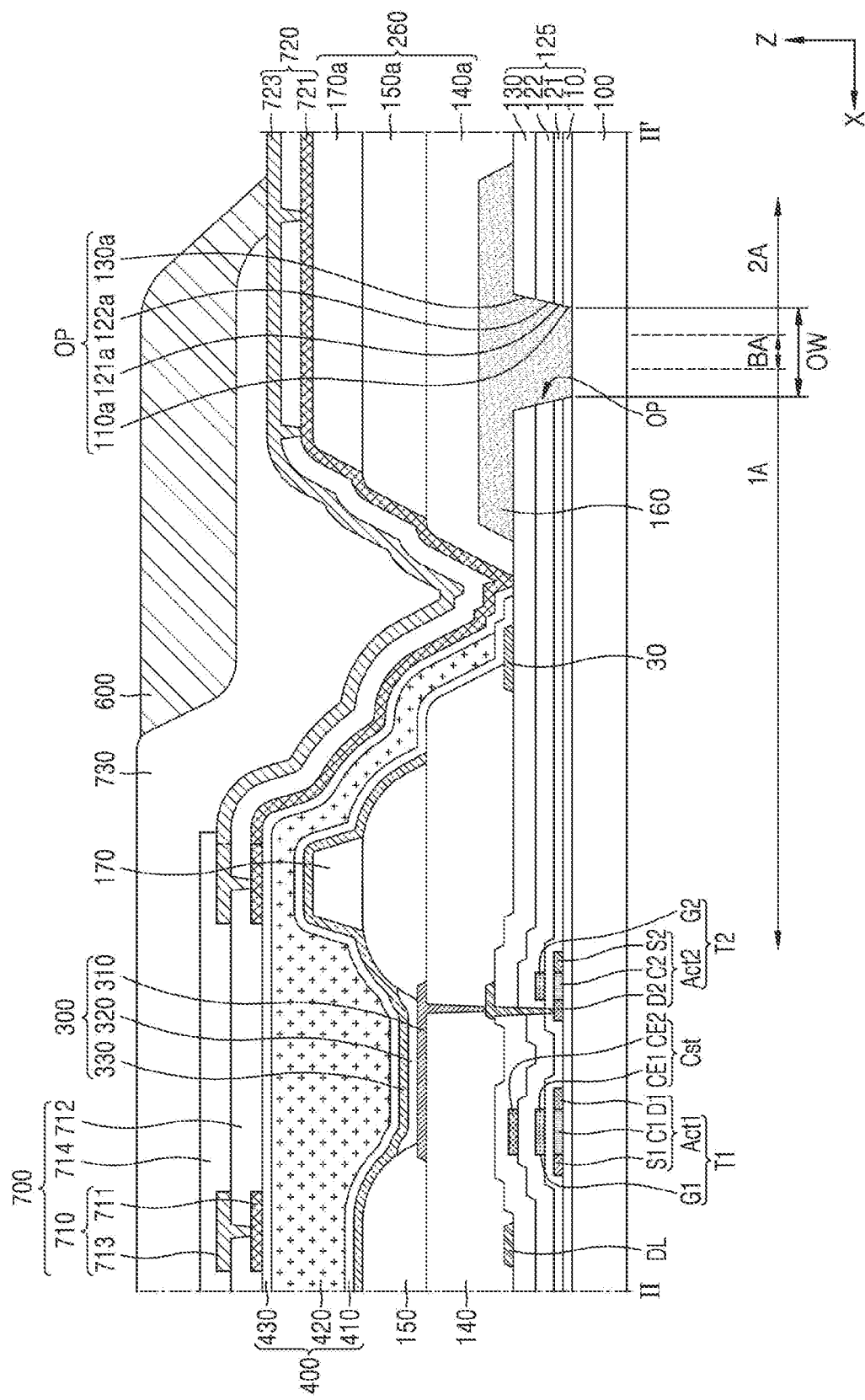
FIG. 13 is a schematic cross-sectional view of a portion of a display apparatus according to another embodiment.

FIG. 13 is a schematic cross-sectional view of a display apparatus according to another embodiment. In FIG. 13, parts or components that are the same as those in FIG. 7 are designated by the same reference numerals, and thus, a repeated description thereof is omitted.

Referring to FIG. 13, the touch wire 720 may have a structure in which a first touch wire layer 721, a touch-organic material layer 722, and a second touch wire layer 723 are sequentially stacked and the first touch wire layer 721 and the second touch wire layer 723 are electrically connected to each other through a via hole. As described above, when the touch wire 720 has a structure in which the first touch wire layer 721 and the second touch wire layer 723 are stacked, electric resistance may decrease, thereby improving sensitivity of the touch wire 720.

The first touch wire layer 721 may be formed of the same material and on the same layer as the first touch conductive layer 711. The second touch wire layer 723 may be formed of the same material and on the same layer as the second touch conductive layer 713. The touch-organic material layer 722 may be disposed between the first touch wire layer 721 and the second touch wire layer 723. When the first insulation layer 712 includes an organic material, the touch-organic material layer 722 may include a material that is the same as that of the first insulation layer 712. Because the touch-organic material layer 722 is disposed at the bending area BA, the touch-organic material layer 722 may include an organic material capable of absorbing a tensile stress during bending.

Each of the first touch wire layer 721 and the second touch wire layer 723 may be a single layer or a multilayer including a conductive material including a transparent conductive layer, Al, Cu and/or T1.

The touch-organic material layer 722 may include one or more materials selected from the group including acryl, metacrylic, polyester, polyethylene, polypropylene, PET, PEN, PC, PI, polyethylene sulfonate, polyoxymethylene, PAR, and HMDSO.

Figure 14:
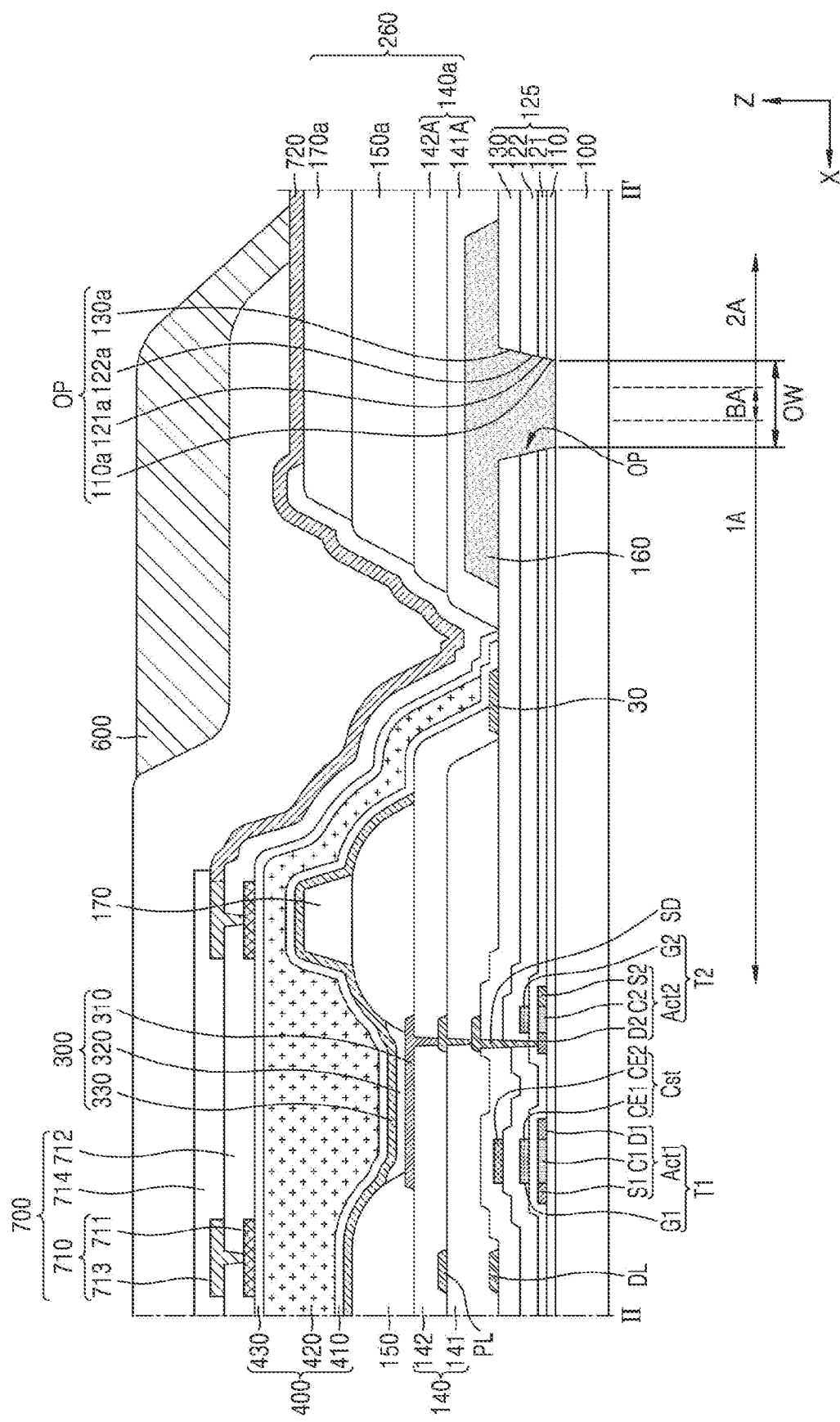
FIG. 14 is a schematic cross-sectional view of a portion of a display apparatus according to another embodiment.

FIG. 14 is a schematic cross-sectional view of a display apparatus according to another embodiment. In FIG. 14, parts or components that are the same as those in FIG. 7 are designated by the same reference numerals, and thus, a repeated description thereof is omitted.

Referring to FIG. 14, the display area DA includes a first planarization layer 141 covering the drain electrode SD and the data line DL and disposed on the interlayer insulation layer 130, a conductive layer PL disposed on the first planarization layer 141, and a second planarization layer 142 covering the conductive layer PL and disposed on the first planarization layer 141. The driving voltage supply line 30 may be formed of the same material as and concurrently (e.g. simultaneously) with the conductive layer PL.

The first planarization layer 141 and the second planarization layer 142, which are insulation layers, may include an organic material. The organic material may include an imide-based polymer, a commercial polymer such as polymethyl methacrylate (PMMA) or polystyrene (PS), a polymer derivative having a phenol-based group, an acryl-based polymer, an acryl ether-based polymer, an amide-based polymer, a fluorine-based polymer, a p-xylene-based polymer, a vinyl alcohol-based polymer, and a blend thereof. The first planarization layer 141 and the second planarization layer 142 may have a single-layer or multi-layer structure.

The conductive layer PL disposed on the first planarization layer 141 may serve as a driving voltage line for transmitting a driving voltage or a data line for transmitting a data signal. The conductive layer PL may be connected to the data line DL disposed on the interlayer insulation layer 130 through a contact hole defined in the first planarization layer 141. The conductive layer PL may include Mo, Al, Cu, T1, etc. and may be a single layer or a multilayer. The conductive layer PL may have a high elongation compared to the first and second gate electrodes G1 and G2 or the second storage capacitor plate CE2. When the conductive layer PL described above is introduced, the connection wire 215 (Refer to FIG. 6) of the fan-out wire 210 (Refer to FIG. 6) may be formed of the same material as and concurrently with the conductive layer PL.

The first upper organic material layer 140a of the upper organic material layer 260 may be provided by stacking a first layer 141A formed of the same material as and concurrently with the first planarization layer 141. A second layer 142A may be formed of the same material as and concurrently with the second planarization layer 142. The first layer 141A may be physically separate from the first planarization layer 141, and the second layer 142A may be physically separate from the second planarization layer 142.

In the embodiments described above, the upper organic material layer 260 is shown as having a step shape, but one or more embodiments are not limited thereto. Various modifications may be made, for example, the second upper organic material layer 150a may cover an end of the first upper organic material layer 140a.

Figure 15:
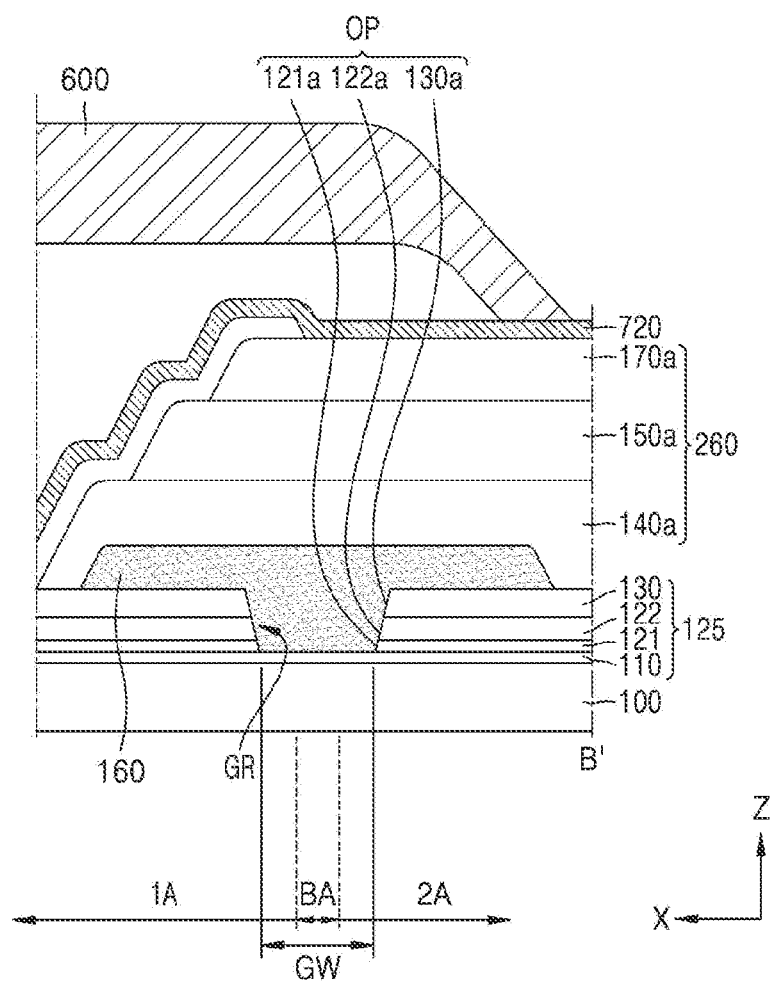
FIG. 15 is a schematic cross-sectional view of a portion of a display apparatus according to another embodiment.

FIG. 15 is a cross-sectional view of a portion of a display apparatus according to another embodiment. In more detail, FIG. 15 is a schematic cross-sectional view of the vicinity of the bending area BA.

Referring to FIG. 15, the inorganic insulation layer 125 may include a groove GR corresponding to the bending area BA. The groove GR may refer to an area where a portion of the inorganic insulation layer 125 is removed in a downward direction (direction −z) and another portion remains. For example, the buffer layer 110 may be continuous over the first area 1A, the bending area BA, and the second area 2A. In addition, the first gate insulation layer 121 may include the opening 121a corresponding to the bending area BA, the second gate insulation layer 122 may include the opening 122a corresponding to the bending area BA, and the interlayer insulation layer 130 may also include the opening 130a corresponding to the bending area BA. Accordingly, the inorganic insulation layer 125 including the buffer layer 110, the first gate insulation layer 121, the second gate insulation layer 122, and the interlayer insulation layer 130 may be understood as including the groove GR corresponding to the bending area BA. The inorganic insulation layer 125 may include the groove GR in other various forms. Various modifications may be made, for example, a portion of an upper surface of the buffer layer 110 (in direction +z) may also be removed, or a lower surface of the first gate insulation layer 121 (in direction −z) may not be removed but remain.

The groove GR corresponding to the bending area BA may be understood as the groove GR overlapping the bending area BA. In this regard, an area of the groove GR may be larger than that of the bending area BA. To this end, FIG. 15 shows a width GW of the groove GR greater than a width of the bending area BA. The area of the groove GR may be defined as an area of an opening, from among the openings 121a, 122a, and 130a of the first and second gate insulation layers 121 and 122 and the interlayer insulation layer 130, having the smallest area.

The inorganic insulation layer 125 is harder than the organic material layer 160 and thus is more likely to crack at the bending area BA, and when the inorganic insulation layer 125 has a crack, probability of the crack spreading to the connection wire 215 increases. Accordingly, probability of the inorganic insulation layer 125 having a crack may be reduced by forming a groove in the inorganic insulation layer 125. Because the organic material layer 160 serving as a stress buffer is disposed in the groove GR, forming the groove GR without forming an opening in the inorganic insulation layer 125 at the bending area BA may sufficiently prevent occurrence of a crack in the connection wire 215.

According to one or more embodiments, the organic material layer 160 may be formed so as to correspond to the bending area BA without forming an opening or a groove in the inorganic insulation layer 125. In this case, the organic material layer 160 may effectively prevent concentration of a tensile stress on the connection wire 215.

Figure 16:
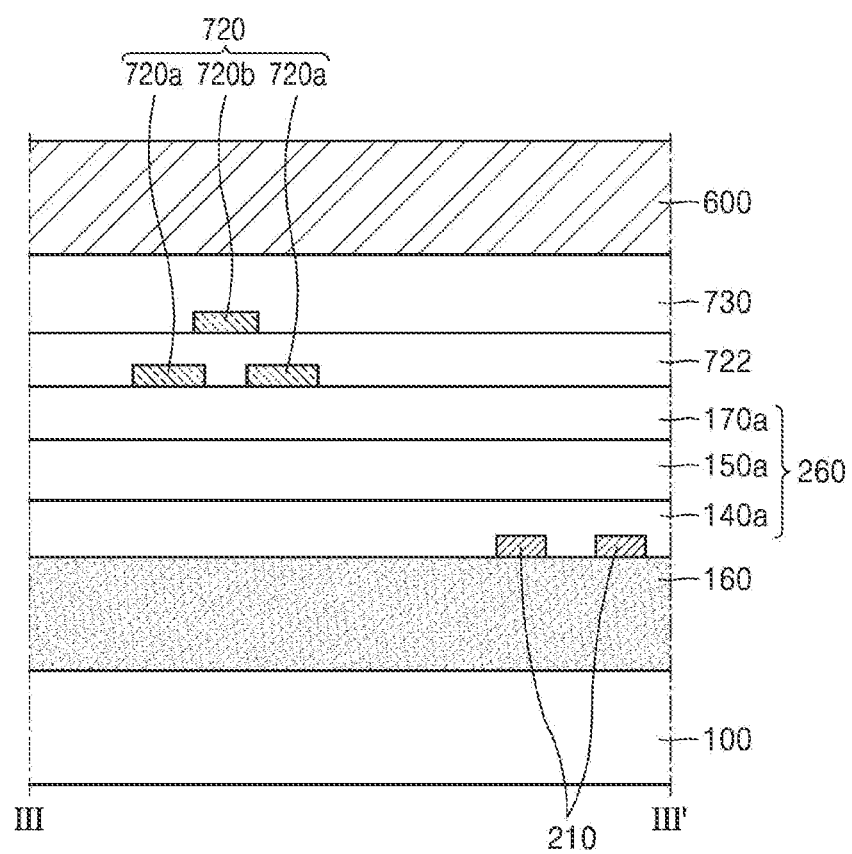
FIG. 16 is a schematic cross-sectional view of a portion of a display apparatus according to another embodiment.

FIG. 16 is a cross-sectional view of a portion of a display apparatus according to another embodiment. In more detail, FIG. 16 is a schematic cross-sectional view of a portion corresponding to line III-III' of FIG. 3.

Referring to FIG. 16, a plurality of touch wires 720 may be provided and may include lower touch wires 720a and upper touch wires 720b disposed on different layers from each other. The touch-organic material layer 722 may be disposed between the lower touch wires 720a and the upper touch wires 720b. The lower touch wires 720a and the upper touch wires 720b may be electrically separate from each other and may be respectively connected to different touch electrodes 710 (Refer to FIGS. 2A and 2B).

A lower touch wire 720a and an upper touch wire 720b may be alternately disposed along the bending axis BAX. In addition, the lower touch wire 720a and the upper touch wire 720b may at least partially overlap each other. Accordingly, an area of the touch wires 720 may be reduced.

The lower touch wires 720a may be formed of the same layer and on the same layer as the first touch conductive layer 711. The upper touch wires 720b may be formed of the same layer and on the same layer as the second touch conductive layer 713.

Each of the lower touch wires 720a and the upper touch wires 720b may be a single layer or a multilayer including a conductive material including a transparent conductive layer, Al, Cu and/or T1.

The touch-organic material layer 722 may include one or more materials selected from the group including acryl, metacrylic, polyester, polyethylene, polypropylene, PET, PEN, PC, PI, polyethylene sulfonate, polyoxymethylene, PAR, and HMDSO.

Figure 17:
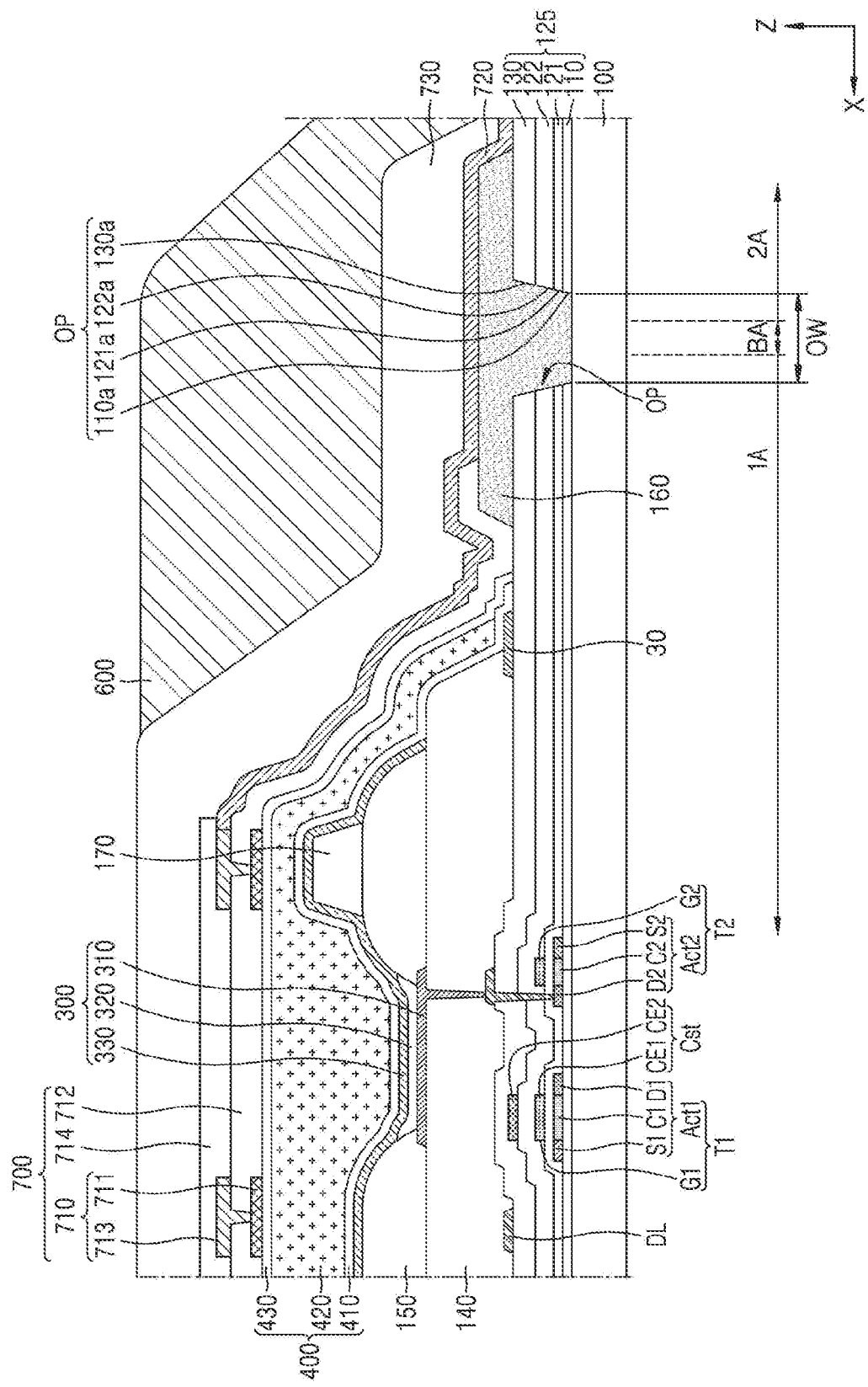
FIG. 17 is a schematic cross-sectional view of a portion of a display apparatus according to another embodiment.
Figure 18:
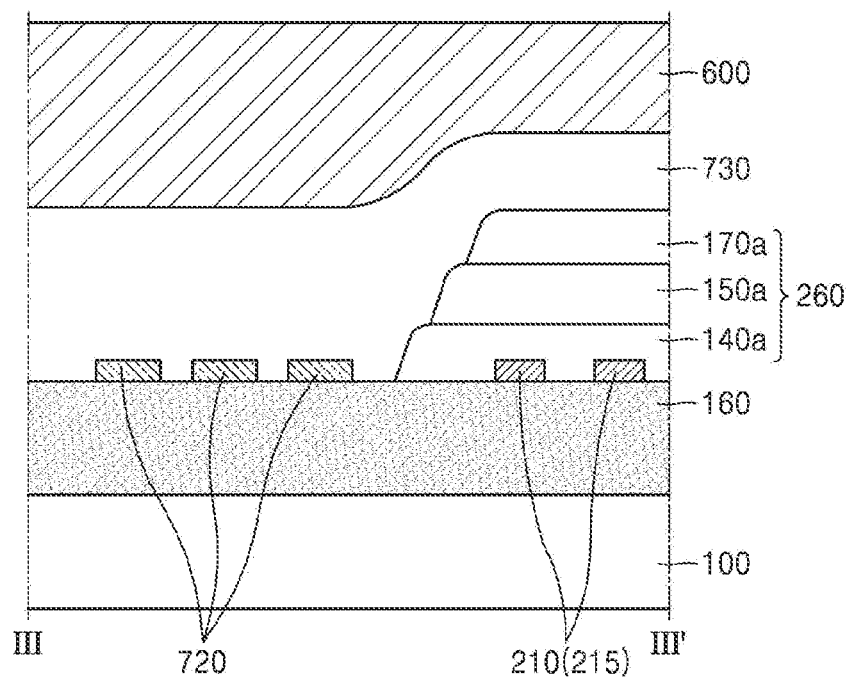
FIG. 18 is a schematic cross-sectional view of a portion of a display apparatus according to another embodiment.

FIG. 17 is a schematic cross-sectional view of a display apparatus according to another embodiment, and FIG. 18 is a cross-sectional view illustrating an area corresponding to line III-III' of FIG. 3 with respect to the embodiment of FIG. 17. In FIG. 17, parts or components that are the same as those in FIG. 7 are designated by the same reference numerals, and thus, a repeated description thereof is omitted. Although a case in which the touch wire 720 and the fan-out wire 210 are disposed on different layers from each other is described in the previous embodiments, the present embodiment is not limited thereto.

Referring to FIGS. 17 and 18, the touch wire 720 may be disposed on the same layer as the connection wire 215 of the fan-out wire 210 at the bending area BA according to various embodiments.

The touch wire 720 may extend from an upper portion of the encapsulation layer 400 and be disposed on an upper surface of the organic material layer 160 at the bending area BA. This may be realized by not forming the upper organic material layer 260 over an area where the touch wire 720 is disposed. That is, the upper organic material layer 260 is formed over the fan-out wires 210 and is not formed over the touch wire 720.

Because the organic material layer 160 is disposed between the touch wire 720 and the substrate 100, the organic material layer 160 may absorb a tensile stress which may be applied to the touch wire 720. The cover layer 730 and the BPL 600 may be disposed on the touch wire 720.

A thickness of the BPL 600 at an upper area of the touch wire 720 may be different from that at an upper area of the fan-out wire 210. This may be determined by taking into account a thickness, a modulus, etc. of a stack formed under the BPL 600 so that a stress neutral plane may be formed near the touch wire 720 and the fan-out wire 210.

In the present embodiment, as the touch wire 720 and the connection wire 215 of the fan-out wire 210 are disposed on the same layer as each other, the stress neutral plane may be located near the touch wire 720 and the connection wire 215 instead of between the touch wire 720 and the connection wire 215, and thus, a tensile stress applied to the touch wire 720 and the connection wire 215 may be reduced.

Embodiments that may be applied to one or more embodiments of the inventive concept have been described above. Such embodiments may be implemented as separate embodiments or may be implemented as a combined embodiment. Various combinations may be made, for example, the embodiment described with reference to FIG. 15, in which a groove is formed in the inorganic insulation layer 125, may be applied to the embodiment described with reference to FIGS. 6 to 14.

As described above, because a touch wire of a display apparatus according to the present embodiments extends from an upper portion of an encapsulation layer to a bending area as one continuous wire, an area of a non-display area may be reduced. In addition, a display apparatus according to the present embodiments may have reduced defects due to a tensile stress during bending through design considering qualities of a fan-out wire and a touch wire, shapes and arrangement of stacks at upper and lower portions of the fan-out wire and the touch wire, and the like.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
  a substrate having a display area on which a display device is located to display an image, and a non-display area around the display area, wherein the non-display area comprises a bending area bent about a bending axis;
  an encapsulation layer over the display area;
  a touchscreen layer over the encapsulation layer and comprising a touch electrode;
  a touch wire connected to the touch electrode, extending from an upper portion of the encapsulation layer, and at least partially in the bending area;
  a fan-out wire configured to apply an electric signal to the display area and at least partially disposed at the bending area; and an upper organic material layer on the fan-out wire,
wherein the touch wire and the fan-out wire are on the same layer in the bending area, and the upper organic material layer is not on the touch wire, and
wherein the upper organic material layer comprises a first upper organic material layer and a second upper organic material layer on the first upper organic material layer, and the second organic material layer exposes an edge portion of an upper surface of the first upper organic material layer so that a step shape is provided on a side of the upper organic material layer.

2. The display apparatus of claim 1, further comprising a bending protection layer over the touch wire and the fan-out wire in the bending area.

3. The display apparatus of claim 1, wherein the fan-out wire comprises a connection wire in the bending area, and an inside wire on a different layer from the connection wire, and the connection wire is connected to the inside wire through a contact hole between the bending area and the display area,
wherein the touch wire continuously extends from the upper portion of the encapsulation layer and is in the bending area.

4. The display apparatus of claim 3, wherein elongations of the touch wire and the connection wire are greater than an elongation of the inside wire.

5. The display apparatus of claim 1, wherein the touch wire comprises a same material as the fan-out wire, and resistivity of the touch wire is different from that of the fan-out wire.

6. The display apparatus of claim 1, further comprising:
an inorganic insulation layer between the substrate and the fan-out wire,
wherein the inorganic insulation layer has an opening or a groove corresponding to the bending area.

7. The display apparatus of claim 6, further comprising:
an organic material layer in at least a portion of the opening or the groove.

8. The display apparatus of claim 1, further comprising:
a thin film transistor in the display area and comprising a semiconductor layer, a gate electrode, a source electrode, and a drain electrode,
wherein the touchscreen layer comprises a first touch conductive layer, a first insulation layer, and a second touch conductive layer which are sequentially stacked,
wherein the fan-out wire is formed of a same material as and concurrently with the source electrode or the drain electrode, and the touch wire is formed of a same material as and concurrently with at least one of the first touch conductive layer and the second touch conductive layer.

* * * * *